(12) United States Patent
Fujita et al.

(10) Patent No.: US 11,506,701 B2
(45) Date of Patent: Nov. 22, 2022

(54) EVALUATION METHOD, ESTIMATION METHOD, EVALUATION APPARATUS, AND COMBINED EVALUATION APPARATUS

(71) Applicant: FUJI ELECTRIC CO., LTD., Kanagawa (JP)

(72) Inventors: Miwako Fujita, Tachikawa (JP); Michio Tamate, Hachioji (JP); Tamiko Asano, Hino (JP); Yuhei Suzuki, Suzuka (JP); Ryu Araki, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 378 days.

(21) Appl. No.: 16/693,373

(22) Filed: Nov. 25, 2019

(65) Prior Publication Data

US 2020/0217884 A1    Jul. 9, 2020

(30) Foreign Application Priority Data

Jan. 7, 2019   (JP) .............................. JP2019-000538

(51) Int. Cl.
  *G01R 31/26* (2020.01)
  *G01R 29/26* (2006.01)
  *G01R 29/08* (2006.01)

(52) U.S. Cl.
  CPC ......... *G01R 31/2626* (2013.01); *G01R 29/26* (2013.01); *G01R 29/0871* (2013.01)

(58) Field of Classification Search
  CPC ........................ G01R 31/2626; G01R 29/26; G01R 29/0871; G01R 31/002
  See application file for complete search history.

(56) References Cited

U.S. PATENT DOCUMENTS

| 7,096,133 | B1* | 8/2006 | Martin ............. | G01R 31/31708 |
| | | | | 702/77 |
| 2016/0218382 | A1* | 7/2016 | Bigarre ............. | H01M 8/04753 |

(Continued)

FOREIGN PATENT DOCUMENTS

| JP | H06309420 A | 11/1994 |
| JP | 2005233833 A | 9/2005 |

(Continued)

OTHER PUBLICATIONS

Office Action issued for counterpart Japanese Application No. 2019-000538, issued by the Japan Patent Office dated Sep. 20, 2022(drafted on Sep. 12, 2022).

*Primary Examiner* — Christopher P McAndrew
*Assistant Examiner* — Zannatul Ferdous

(57) ABSTRACT

The electromagnetic noise of a semiconductor device is conveniently evaluated, and the electromagnetic noise of an apparatus equipped with the semiconductor device is estimated. An evaluation method is provided which includes causing one of a first device and a second device of a semiconductor device to perform a switching operation, the semiconductor device comprising the first device and second device connected in series and a third device and a fourth device connected to each other in series and connected parallel to a series circuit of the first device and second device; measuring voltage variation occurring between the third device and the fourth device during the switching operation; and outputting an evaluation benchmark for electromagnetic noise of the semiconductor device, based on the voltage variation.

18 Claims, 19 Drawing Sheets

(56) References Cited

U.S. PATENT DOCUMENTS

| | | | | |
|---|---|---|---|---|
| 2017/0317075 | A1* | 11/2017 | Arai | H01L 29/32 |
| 2018/0045764 | A1* | 2/2018 | Heinrich | H01L 29/0649 |
| 2018/0238937 | A1* | 8/2018 | Nakajima | G03G 15/2039 |
| 2018/0238941 | A1* | 8/2018 | Ko | G01R 35/005 |
| 2019/0170798 | A1 | 6/2019 | Katsumata | |
| 2019/0170807 | A1 | 6/2019 | Katsumata | |
| 2021/0159731 | A1* | 5/2021 | Nakao | H01F 38/14 |

FOREIGN PATENT DOCUMENTS

| | | | |
|---|---|---|---|
| JP | 2009290938 | A | 12/2009 |
| JP | 2014135095 | A | 7/2014 |
| JP | 6187717 | B1 | 8/2017 |
| JP | 6191797 | B1 | 9/2017 |
| JP | 2018141631 | A | 9/2018 |
| JP | 7067125 | B2 | 5/2022 |

* cited by examiner

EVALUATION METHOD, ESTIMATION METHOD, EVALUATION APPARATUS, AND COMBINED EVALUATION APPARATUS

The contents of the following Japanese patent application(s) are incorporated herein by reference:
2019-000538 filed in JP on Jan. 7, 2019

BACKGROUND

1. Technical Field

The present invention relates to an evaluation method, an estimation method, an evaluation apparatus, and a combined evaluation apparatus.

2. Related Art

In the related art, for electromagnetic noise (conducted and radiated types) generated by electrical/electronic equipment, including power conversion apparatuses such as inverters and PWM rectifiers, a limit value is set by EMC (Electro-Magnetic Compatibility) standards. The electromagnetic noise of which limit value is set by the standards includes conducted noise to return to a power supply and radiated noise to propagate to surrounding space, and is required to be sufficiently reduced so that an intensity of the electromagnetic noise is not to exceed the limit value set by the standards. A method is proposed for evaluating the electromagnetic noise generated during an operation of the power conversion apparatus by means of simulation or simple measurement (for example, refer to Patent Documents 1 to 3). Also, as a method for evaluating radiated noise of a semiconductor device, a method of using simulation and a method of measuring voltage variation as disclosed in Patent Document 4 are suggested.

Patent Document 1: Japanese Patent Application Publication No. H6-309420
Patent Document 2: Japanese Patent Application Publication No. 2014-135095
The Patent Document 3: Japanese Patent Application Publication No. 2005-233833
The Patent Document 4: Japanese Patent No. 6,191,797B

SUMMARY

Such simulation uses analysis models. However, the analysis models can be created only after determining details of a circuit board and a housing structure of the power conversion apparatus. Also, the electromagnetic noise evaluation by means of simple measurement can be performed only after completing the power conversion apparatus. Therefore, the electromagnetic noise may be evaluated as "not conforming to the standards" after completing the power conversion apparatus. Also, according to the method for evaluating the noise of the device by means of measurement of the voltage variation, an error resulting from a difference of configurations of an evaluation apparatus and the power conversion apparatus may occur and the electromagnetic noise may be evaluated as "not conforming to the standards" after completing the power conversion apparatus, due to an influence of a small stray circuit and the like around the device. In this case, EMC filter design, components selection, circuit board artwork, structure consideration and the like need to be carried out again.

In order to solve the above problems, a first aspect of the present invention provides an evaluation method. The evaluation method may include causing one of a first device and a second device of a semiconductor device to perform a switching operation, the semiconductor device including the first device and second device connected in series and a third device and a fourth device connected to each other in series and connected parallel to a series circuit of the first device and second device. The evaluation method may include measuring voltage variation occurring between the third device and the fourth device during the switching operation. The evaluation method may include outputting an evaluation benchmark for electromagnetic noise of the semiconductor device, based on the voltage variation.

The semiconductor device may further include a fifth device and a sixth device connected to each other in series and connected parallel to the series circuit of the first device and second device, and the measuring may further include measuring voltage variation occurring between the fifth device and the sixth device during the switching operation.

A second aspect of the present invention provides an evaluation method. The evaluation method may include causing one of a first device and a second device of a semiconductor device to perform a switching operation, the semiconductor device including the first device and second device connected in series and a third device and a fourth device connected to each other in series and connected parallel to a series circuit of the first device and second device. The evaluation method may include measuring voltage variation occurring in at least one of the third device and the fourth device during the switching operation. The evaluation method may include outputting an evaluation benchmark for electromagnetic noise of the semiconductor device, based on the voltage variation.

The semiconductor device may further include a fifth device and a sixth device connected to each other in series and connected parallel to the series circuit of the first device and second device, and the measuring may further include measuring voltage variation occurring in at least one of the fifth device and the sixth device during the switching operation.

The evaluation method may further include comparing the evaluation benchmark output to the semiconductor device and the evaluation benchmark output to a reference device different from the semiconductor device, and evaluating an intensity of the electromagnetic noise of the semiconductor device as compared to the reference device, based on a result of the comparison.

The outputting the evaluation benchmark may include calculating the voltage variation in the semiconductor device for each frequency component, as the evaluation benchmark.

The switching operation may include at least two of a turn-on operation, a turn-off operation, a reverse recovery operation and a forward recovery operation of the semiconductor device.

The switching operation may include at least the reverse recovery operation of the semiconductor device.

The measuring may include measuring variation in a voltage of the semiconductor device relative to a reference potential, the reference potential being a potential of a conductive member to which the semiconductor device is attached via an insulating material.

A third aspect of the present invention provides an estimation method. The estimation method may be configured to estimate electromagnetic noise of an apparatus provided with the semiconductor device. The estimation method may include acquiring a plurality of evaluation benchmarks for the semiconductor device that are output in correspondence with the switching operation under a plurality of conditions by using the above-described evaluation method. The estimation method may include combining the plurality of evaluation benchmarks to estimate the electromagnetic noise of the apparatus.

A combination of the evaluation benchmarks may be a maximum value or a sum of the plurality of evaluation benchmarks for the semiconductor device.

A combination of the evaluation benchmarks may be an average value of the plurality of evaluation benchmarks for the semiconductor device.

A combination of the evaluation benchmarks may be an average value calculated after multiplying the plurality of evaluation benchmarks for the semiconductor device by respective weights corresponding to the plurality of conditions.

A fourth aspect of the present invention provides an evaluation apparatus. The evaluation apparatus may include a signal supplying unit configured to supply a predetermined switching signal to a semiconductor device including a first device and a second device connected in series and a third device and a fourth device connected to each other in series and connected parallel to a series circuit of the first device and second device. The evaluation apparatus may include a detection unit configured to detect voltage variation occurring between the third device and the fourth device during a switching operation of one of the first device and the second device. The evaluation apparatus may include an evaluation benchmark output unit configured to output an evaluation benchmark for electromagnetic noise of the semiconductor device, based on a detection result of the detection unit.

The semiconductor device may further include a fifth device and a sixth device connected to each other in series and connected parallel to the series circuit of the first device and second device, and the detection unit may be further configured to detect voltage variation occurring between the fifth device and the sixth device.

A fifth aspect of the present invention provides an evaluation apparatus. The evaluation apparatus may include a signal supplying unit configured to supply a predetermined switching signal to a semiconductor device including a first device and a second device connected in series and a third device and a fourth device connected to each other in series and connected parallel to a series circuit of the first device and second device. The evaluation apparatus may include a detection unit configured to detect voltage variation occurring in at least one of the third device and the fourth device during a switching operation of one of the first device and the second device. The evaluation apparatus may include an evaluation benchmark output unit configured to output an evaluation benchmark for electromagnetic noise of the semiconductor device, based on a detection result of the detection unit.

The semiconductor device may further include a fifth device and a sixth device connected to each other in series and connected parallel to the series circuit of the first device and second device, and the detection unit may be further configured to detect voltage variation occurring in at least one of the fifth device and the sixth device.

The evaluation apparatus may further include a storage unit configured to store the evaluation benchmark output by the evaluation benchmark output unit, a comparison unit configured to compare the evaluation benchmark output by the evaluation benchmark output unit and the evaluation benchmark output to a reference device different from the semiconductor device stored in the storage unit, and an evaluation unit configured to evaluate a relative change in intensity of the evaluation benchmark for the electromagnetic noise of the semiconductor device, based on a result of the comparison.

A sixth aspect of the present invention provides an evaluation apparatus. The evaluation apparatus may include a signal supplying unit configured to supply a predetermined switching signal to a to-be-evaluated semiconductor device. The evaluation apparatus may include a detection unit configured to detect voltage variation in a semiconductor device connected parallel to the semiconductor device. The evaluation apparatus may include an evaluation benchmark output unit configured to output an evaluation benchmark for electromagnetic noise of the semiconductor device, based on a detection result of the detection unit. The evaluation apparatus may include a storage unit configured to store the evaluation benchmark output by the evaluation benchmark output unit. The evaluation apparatus may include a comparison unit configured to compare the evaluation benchmark output by the evaluation benchmark output unit and the evaluation benchmark output to a reference device different from the semiconductor device stored in the storage unit. The evaluation apparatus may include an evaluation unit configured to evaluate a relative change in intensity of the evaluation benchmark for the electromagnetic noise of the semiconductor device, based on a result of the comparison.

The evaluation benchmark output unit may be configured to calculate an electric field strength corresponding to the electromagnetic noise of the semiconductor device, based on a frequency component of the voltage variation.

The signal supplying unit may be configured to supply a switching signal to cause the semiconductor device to perform at least two of a turn-on operation, a turn-off operation, a reverse recovery operation and a forward recovery operation.

A seventh aspect of the present invention provides a combined evaluation apparatus. The combined evaluation apparatus may include an acquisition unit configured to acquire a plurality of evaluation benchmarks for the semiconductor device that are output in correspondence with the switching signal under a plurality of conditions by the above-described evaluation apparatus. The combined evaluation apparatus may include a combined evaluation unit configured to combine the plurality of evaluation benchmarks to estimate electromagnetic noise of an apparatus provided with the semiconductor device.

In the meantime, the summary of the present invention does not necessarily describe all necessary features of the present invention. The present invention may also be a sub-combination of the features described above.

DESCRIPTION OF EXEMPLARY EMBODIMENTS

Hereinbelow, embodiments of the present invention will be described. The embodiments do not limit the invention according to the claims. Also, all combinations of features described in the embodiments are not necessarily essential to solving means of the invention.

Figure 1:
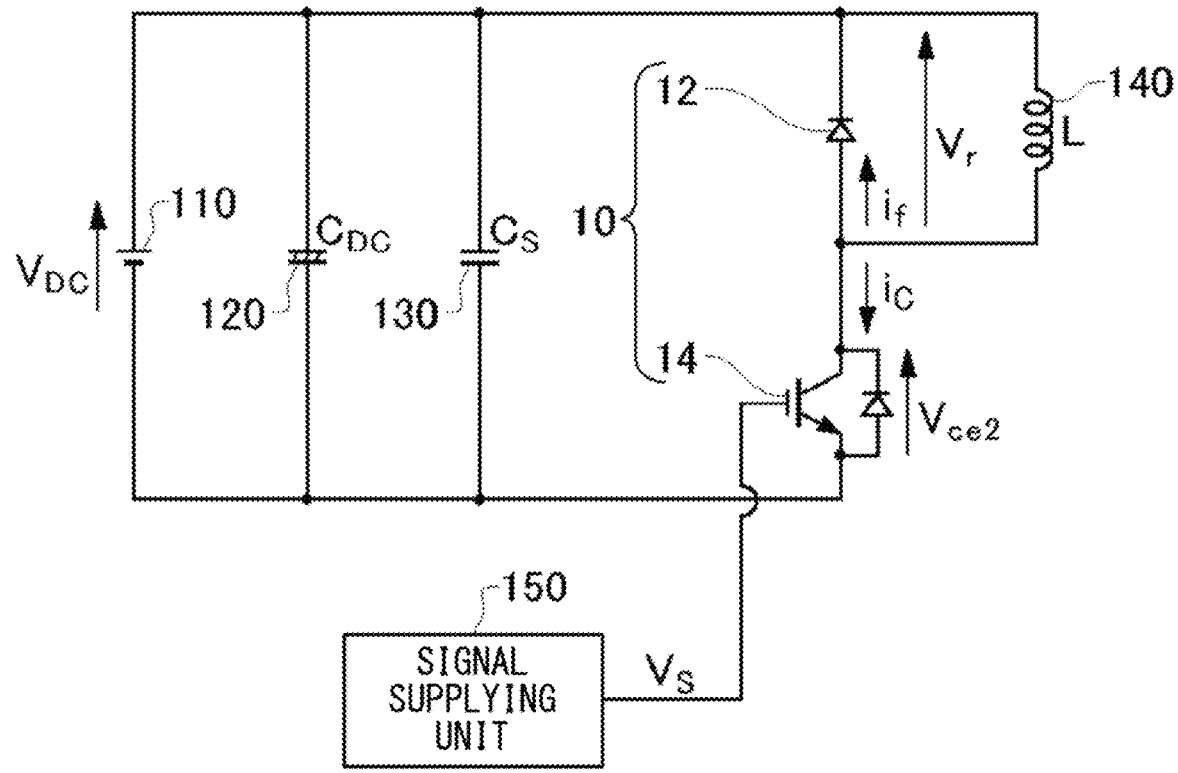
FIG. 1 shows a configuration example of an evaluation circuit 100 for evaluating switching characteristics of a semiconductor device 10.

FIG. 1 shows an example configuration of an evaluation circuit 100 for evaluating switching characteristics of a semiconductor device 10. An example is shown in which the to-be-evaluated semiconductor device 10 includes a first device 12 and a second device 14 connected in series. FIG. 1 shows an example in which the first device 12 is a diode and the second device 14 is a combination of an IGBT and an anti-parallel connected diode. Using the evaluation circuit 100 shown in FIG. 1, switching losses, voltage overshoots and the like of the semiconductor device 10 can be evaluated by performing turn-on operations, turn-off operations and the like of the second device 14. The evaluation circuit 100 includes a power supply 110, a first capacitive unit 120, a second capacitive unit 130, a load reactor 140, and a signal supplying unit 150.

The power supply 110 is a DC power supply which outputs a DC voltage $V_{DC}$. The power supply 110 is connected to both ends of the semiconductor device 10. For example, the power supply 110 is connected to one end (the cathode terminal) of the first device 12 and the other end (the emitter terminal) of the second device 14, and supplies the DC voltage to the first device 12 and the second device 14. In this case, the other end (the anode terminal) of the first device 12 is connected to one end (the collector terminal) of the second device 14.

The first capacitive unit 120 is connected parallel to the semiconductor device 10, and smoothens the DC voltage $V_{DC}$ output from the power supply 110. The first capacitive unit 120 is a capacitor having a capacitance $C_{DC}$, for example. The first capacitive unit 120 is an electrolytic capacitor, as an example. The second capacitive unit 130 is connected parallel to the semiconductor device 10, and reduces voltage overshoots. The second capacitive unit 130 is a capacitor having a capacitance $C_S$, for example. It is desirable that the first capacitive unit 120 and the second capacitive unit 130 are capacitors having different capacitances, for example, the capacitance $C_{DC}$ is larger than the capacitance $C_S$.

The load reactor 140 is connected to both ends the first device 12. The load reactor 140 has an inductance L, as an example.

The signal supplying unit 150 supplies a predetermined switching signal to the semiconductor device 10. For example, the signal supplying unit 150 includes a pulse generator, an amplification circuit and the like, and supplies a pulsed switching signal $V_S$ to the gate terminal of the second device 14. In the second device 14, when the switching signal $V_S$ is supplied to the gate terminal, the electrical connection between the collector terminal and the emitter terminal is switched between a connected state (ON state) and a disconnected state (OFF state).

In the above evaluation circuit 100, the semiconductor device 10 can be caused to perform switching operations by supplying the switching signal to the second device 14. Therefore, switching characteristics of the second device 14 can be acquired by, for example, measuring a collector current $i_c$ flowing in the collector terminal during the switching operations with an external measurement apparatus or the like.

Also, the switching characteristics of the first device 12 can be evaluated by measuring a forward current $i_f$ flowing in the first device 12 during the switching operations with an external measurement apparatus or the like. Note that the voltage between the collector and emitter terminals of the second device 14 is referred to as $V_{ce2}$, and the voltage across the first device 12 is referred to as $V_r$. The measurement of the switching characteristics using the evaluation circuit 100 is described as follows.

Figure 2:
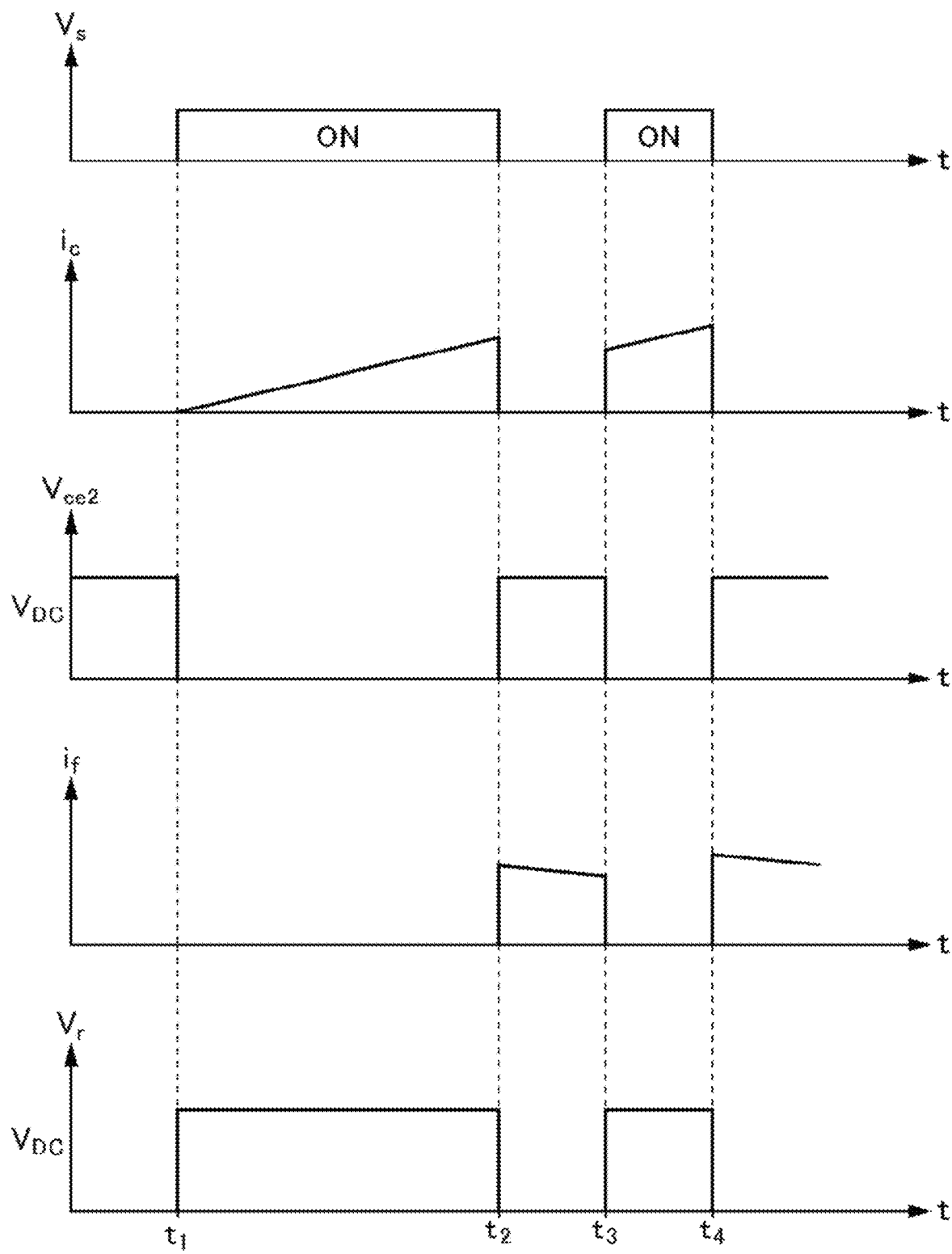
FIG. 2 shows an example of a result of measuring the switching characteristics of the semiconductor device 10 by using the evaluation circuit 100.

FIG. 2 shows an example of the result of measuring the switching characteristics of the semiconductor device 10 using the evaluation circuit 100. In FIG. 2, the horizontal axis indicates time and the vertical axis indicates voltage values or current values. FIG. 2 shows an example in which the evaluation circuit 100 switches the second device 14 between the ON state and the OFF state with the switching signal $V_S$ to cause the second device 14 to perform turn-on operations and turn-off operations.

At time $t_1$, the switching signal $V_S$ becomes a high voltage and turns the second device 14 to the ON state. When conduction is made between the collector terminal and the emitter terminal of the second device 14, current flows from the power supply 110 through the load reactor 140 into the second device 14. The current flowing into the second device 14 is observed as a collector current $i_c$, and increases at a substantially constant rate of change di/dt from time $t_1$. The rate of change di/dt is represented by the following equation.

$$di/dt = V_{DC}/L \qquad \text{(Equation 1)}$$

At time $t_2$, the switching signal $V_S$ becomes a low voltage and turns the second device 14 to the OFF state. In the evaluation circuit 100, the time period from time $t_1$ to time $t_2$ may be set such that the second device 14 is switched to the OFF state at the time point when a predetermined amount of the collector current $i_c$ flows. In this manner, in the evaluation circuit 100, the turn-off operation of the second device 14 can be performed under a predetermined condition of the collector current $i_c$. That is, the transient response of the second device 14 for its turn-off operation under a predetermined condition of the collector current $i_c$ can be measured.

The voltage $V_{ce2}$ between the collector and emitter terminals is substantially the same as the DC voltage $V_{DC}$ during the time period until time $t_1$, in which the second device 14 is in the OFF state. During the time period from time $t_1$ to time $t_2$, the second device 14 is in the ON state, and thus the voltage $V_{ce2}$ between the terminals is substantially 0 V. During the time period until time $t_2$, no current flows in the first device 12, and thus the forward current $i_f$ is substantially 0 A. The voltage $V_r$ across the first device 12 is substantially 0 V until time $t_1$, and is substantially the same as the DC voltage $V_{DC}$ during the time period from time $t_1$ to time $t_2$.

When the second device 14 is turned to the OFF state at time $t_2$, the load reactor 140 acts to continuously pass the current that has been flowing therein, and therefore the current refluxes along a path from the load reactor 140 to the first device 12. Therefore, the forward current $i_f$ of the first device 12 rises at time $t_2$, and its current value gradually decreases over time. Note that the rising of the forward current $i_f$ of the first device 12 at time $t_2$ is referred to as a forward recovery operation. By turning the second device 14 to the ON state while the forward current $i_f$ flows in the first device 12, a reverse recovery operation of the first device 12 and a turn-on operation of the second device 14 can be performed.

In the evaluation circuit 100, the time period from time $t_2$ to time $t_3$ may be set such that the second device 14 is switched to the ON state at the time point when a predetermined amount of the forward current $i_f$ flows. In this manner, in the evaluation circuit 100, the reverse recovery operation of the first device 12 and the turn-on operation of the second device 14 can be performed under a predetermined condition of the forward current $i_f$. That is, the transient response of the second device 14 and the first device 12 for the turn-on operation of the second device 14 under a predetermined condition of the forward current $i_f$ can be measured.

Thus, at time $t_3$, the switching signal $V_S$ becomes a high voltage again and turns the second device 14 to the ON state. The voltage $V_{ce2}$ between the terminals of the second device 14 is substantially the same voltage as the DC voltage $V_{DC}$ during the time period from time $t_2$ to time $t_3$, in which the second device 14 is in OFF state, and becomes substantially 0 V again from time $t_3$. The voltage $V_r$ across the first device 12 is substantially 0 V during the time period from time $t_2$ to time $t_3$, and becomes substantially the same as the DC voltage $V_{DC}$ again from time $t_3$.

The forward recovery operation of the first device 12 and the turn-off operation of the second device 14 can be observed at least partially in the same time region with the same switching signal $V_S$. Similarly, the reverse recovery operation of the first device 12 and the turn-on operation of the second device 14 can be observed at least partially in the same time region with the same switching signal $V_S$.

For example, a case is considered in which the signal supplying unit 150 supplies the switching signal $V_S$ to the gate terminal of the second device 14 to cause the second device 14 to perform a turn-on operation. In this case, turn-on characteristics of the second device 14 can be observed by detecting the transient response of the voltage $V_{ce2}$ between the collector and emitter terminals of the second device 14. Also, forward recovery characteristics of the first device 12 can be observed by detecting the current $i_f$ flowing in the first device 12.

Similarly, a case is considered in which the signal supplying unit 150 supplies the switching signal $V_S$ to the gate terminal of the second device 14 to cause the second device 14 to perform a turn-off operation. In this case, turn-off characteristics of the second device 14 can be observed by detecting the voltage $V_{ce2}$ between the collector and emitter terminals of the second device 14. Also, reverse recovery characteristics of the first device 12 can be observed by detecting the current $i_f$ flowing in the first device 12.

The switching characteristics of the semiconductor device 10 are thus measured using the evaluation circuit 100 and, for example, if evaluated to be a non-defective product that meets a predetermined criterion, the semiconductor device 10 is shipped to the market or the like. However, even if a power conversion apparatus or the like is manufactured using the semiconductor device 10 with good switching characteristics, electromagnetic noise generated by the power conversion apparatus may exceed a standard value defined by the EMC standards. In this case, EMC filter design, re-selection of parts including the semiconductor device 10, circuit board artwork, structure consideration and the like needs to be conducted again after completing the power conversion apparatus, and enormous trouble and cost would occur.

Therefore, in addition to evaluating the switching characteristics of the semiconductor device 10, the evaluation apparatus 200 according to the present embodiment is configured to evaluate radiated noise of the semiconductor device 10 and to output an evaluation benchmark. In this manner, radiated noise generated by a power conversion apparatus and the like equipped with the semiconductor device 10 can be estimated before completing the power conversion apparatus, so that the trouble and cost involved in the manufacturing process are reduced. In the meantime, the semiconductor device 10 that is to be evaluated by the evaluation apparatus 200 according to the present embodiment includes a device different from the semiconductor device 10 shown in FIG. 1. Such an evaluation apparatus 200 is described as follows.

Figure 3:
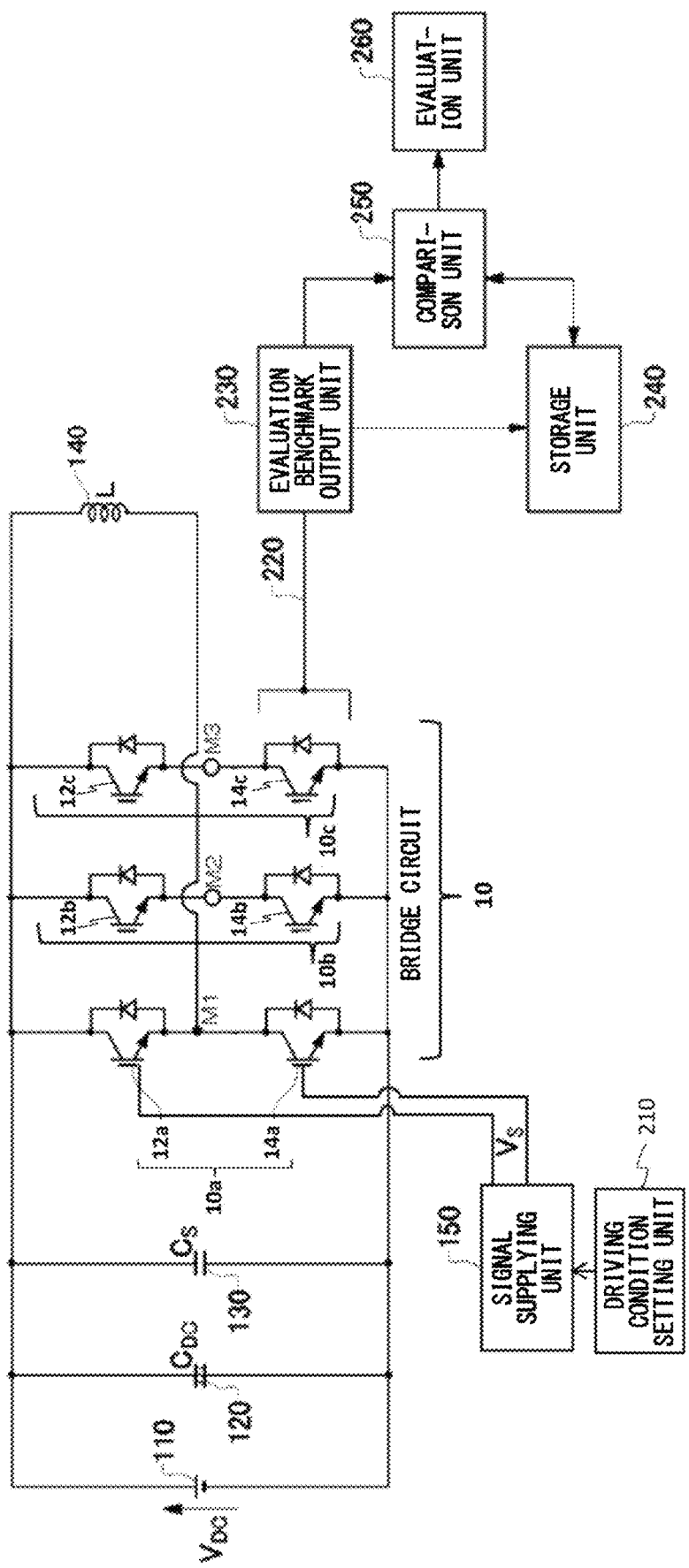
FIG. 3 shows a configuration example of an evaluation apparatus 200 in the present embodiment, together with the to-be-evaluated semiconductor device 10.

FIG. 3 shows a configuration example of the evaluation apparatus 200 in the present embodiment, together with the to-be-evaluated semiconductor device 10. A configuration of the evaluation apparatus 200 is partially similar to the evaluation circuit 100 shown in FIG. 1. Therefore, the evaluation apparatus 200 can be used to evaluate the switching characteristics of the semiconductor device 10 described with reference to FIG. 1 and FIG. 2. The evaluation apparatus 200 includes a power supply 110, a first capacitive unit 120, a second capacitive unit 130, a load reactor 140, a signal supplying unit 150, a driving condition setting unit 210, a detection unit 220, an evaluation benchmark output unit 230, a storage unit 240, a comparison unit 250, and an evaluation unit 260.

The power supply 110, the first capacitive unit 120, the second capacitive unit 130, the load reactor 140, and the signal supplying unit 150 shown in FIG. 3 operate in substantially the same manner as the power supply 110, the first capacitive unit 120, the second capacitive unit 130, the load reactor 140 and the signal supplying unit 150 described with reference to FIG. 1, and they are denoted with the same reference signs. Therefore, the descriptions thereof are omitted here.

In FIG. 3, the to-be-evaluated semiconductor device 10 includes a first series circuit 10a, a second series circuit 10b, and a third series circuit 10c. The first series circuit 10a includes a first device 12a and a second device 14a connected in series. The second series circuit 10b includes a third device 12b and a fourth device 14b connected in series. The third series circuit 10c includes a fifth device 12c and a sixth device 14c connected in series. That is, the semiconductor device 10 includes the first device 12a and second device 14b connected in series, and the third device 12b and fourth device 14b connected to each other in series and connected parallel to the series circuit of the first device 12a and the second device 14b. Also, the semiconductor device 10 further includes the fifth device 12c and sixth device 14c connected to each other in series and connected parallel to the series circuit of the first device 12a and second device 14b. Here, the first device 12a to the sixth device 14c are semiconductor switches such as MOSFET or IGBT, for example. FIG. 3 shows an example in which the first device 12a to the sixth device 14c are IGBTs to which respective diodes are anti-parallel connected. That is, the load reactor 140 is connected between one and other ends of the first device 12a, where the one end of the first device 12a is a collector terminal and the other end is an emitter terminal. Although some are not shown, gate terminals of the first device 12a to the sixth device 14c are respectively connected to the signal supplying unit 150. The respective devices connected in series may be configured by a combination of discrete elements or by a 2-in-1 module. Also, the bridge circuit may be configured by a combination of discrete elements, a combination of 2-in-1 modules, a 6-in-1 module, an IPM (Intelligent Power Module), or the like. A configuration is favorable which is significantly similar to the case in which the to-be-evaluated device configures the power conversion apparatus.

The driving condition setting unit 210 is connected to the signal supplying unit 150, and is configured to set conditions under which the signal supplying unit 150 is to drive each device of the semiconductor device 10. For example, the driving condition setting unit 210 is configured to set a plurality of driving conditions in which timings and magnitudes of signals, which are to be respectively supplied to the gate terminals of the respective devices of the semiconductor device 10 by the signal supplying unit 150, are made different from each other.

The detection unit 220 is configured to detect voltage variation in the semiconductor device 10. The detection unit 220 is configured to detect voltage variation in the semiconductor device 10 occurring in association with the switching operation, for example. For example, the detection unit 220 is configured to detect voltage variation occurring between the third device 12b and the fourth device 14b during a switching operation in which one of the first device 12a and the second device 14a of the semiconductor device 10 is caused to perform a switching operation. Alternatively, the detection unit 220 may be configured to detect variation in at least one voltage between terminals of a voltage $V_{ce3}$ between the collector and emitter terminals, i.e., between one and other ends of the third device 12b and a voltage $V_{ce4}$ between the collector and emitter terminals, i.e., between one and other ends of the fourth device 14b, during the switching operation. Also, the detection unit 220 may be configured to detect voltage variation occurring between the fifth device 12c and the sixth device 14c during the switching operation. Alternatively, the detection unit 220 may be configured to detect variation in at least one voltage between terminals of a voltage $V_{ce5}$ between the collector and emitter terminals, i.e., between one and other ends of the fifth device 12c and a voltage $V_{ce6}$ between the collector and emitter terminals, i.e., between one and other ends of the sixth device 14c, during the switching operation. Also, the detection unit 220 may be configured to detect voltage variation occurring between the first device 12a and the second device 14a during the switching operation. Alternatively, the detection unit 220 may be configured to detect variation in at least one voltage between terminals of a voltage $V_{ce1}$ between the collector and emitter terminals, i.e., between one and other ends of the first device 12a and a voltage $V_{ce2}$ between the collector and emitter terminals, i.e., between one and other ends of the second device 14a, during the switching operation. The detection unit 220 has voltage probes, and the voltage probes are electrically connected to one and other ends of the first device 12a to the sixth device 14c.

In the meantime, the detection unit 220 is configured to detect voltage variation in at least one of the second series circuit 10b and the third series circuit 10c connected parallel to the first series circuit 10a, during the switching operation of the first series circuit 10a. In this case, the detection unit 220 may be configured to detect voltage variation in only one of the second series circuit 10b and the third series circuit 10c or voltage variation in both the series circuits. In addition to this, the detection unit 220 may be configured to detect voltage variation in the first series circuit 10a subjected to the switching operation. In the description above, the example in which the first series circuit 10a is caused to perform the switching operation is shown. However, the present invention is not limited thereto. For example, the detection unit 220 may be configured to detect voltage variation in at least one of the first series circuit 10a and the third series circuit 10c during the switching operation of the second series circuit 10b or voltage variation in at least one of the first series circuit 10a and the second series circuit 10b during the switching operation of the third series circuit 10c.

The evaluation benchmark output unit 230 is configured to output an evaluation benchmark for radiated noise of the semiconductor device 10, based on a detection result of the detection unit 220. The evaluation benchmark output unit 230 is configured to output frequency components of the voltage variation detected by the detection unit 220, as the evaluation benchmark for radiated noise. As an example, the evaluation benchmark output unit 230 includes a measurement instrument for performing frequency domain measurement, such as a spectrum analyzer, and is configured to output a result of the frequency domain measurement, as the evaluation benchmark. Also, the evaluation benchmark output unit 230 includes an instrument for time domain measurement, such as an oscilloscope, and is configured to perform Fourier transform on a result of the time domain measurement to thereby convert the same into frequency domain data, and to output the frequency domain data, as the evaluation benchmark. The evaluation benchmark output unit 230 is configured to supply the evaluation benchmark to the storage unit 240 and the comparison unit 250.

The storage unit 240 is configured to store the evaluation benchmark output by the evaluation benchmark output unit 230. For example, the storage unit 240 is configured to store the evaluation benchmark by associating the same with the to-be-evaluated semiconductor device 10 evaluated by the evaluation apparatus 200. As an example, the storage unit 240 may be configured to serve as an evaluation benchmark database for storing previous evaluation benchmarks output by the evaluation apparatus 200 after performing evaluations. In the meantime, the storage unit 240 may be provided either internal or external to the evaluation apparatus 200. Also, the storage unit 240 may be configured as a database connected to the body of the evaluation apparatus 200 via a network or the like.

The comparison unit 250 is configured to compare the evaluation benchmark output by the evaluation benchmark output unit 230 at the present cycle and a previous evaluation benchmark for a reference device different from the semiconductor device 10 stored in the storage unit 240. In a case in which the semiconductor device 10 is an improved version of the reference device, the comparison unit 250 is configured to compare an evaluation benchmark for the reference device before the improvement and an evaluation benchmark for the semiconductor device 10 after the improvement.

The evaluation unit 260 is configured to evaluate a relative change in intensity of the radiated noise of the semiconductor device 10, based on a comparison result of the comparison unit 250. The evaluation unit 260 is configured to output an evaluation result. The evaluation unit 260 may be configured to output the evaluation result to a display device or the like, and further to output the same to an external database or the like. Also, the evaluation unit 260 may be configured to output the evaluation result in a predetermined format such as a data sheet.

The evaluation apparatus 200 according to the present embodiment evaluates the radiated noise of the to-be-evaluated semiconductor device 10 shown in FIG. 3 by causing the semiconductor device 10 described with reference to FIG. 1 and FIG. 2 to perform switching operations.

The evaluation operations on the semiconductor device 10 by the evaluation apparatus 200 are described as follows.

Figure 4:
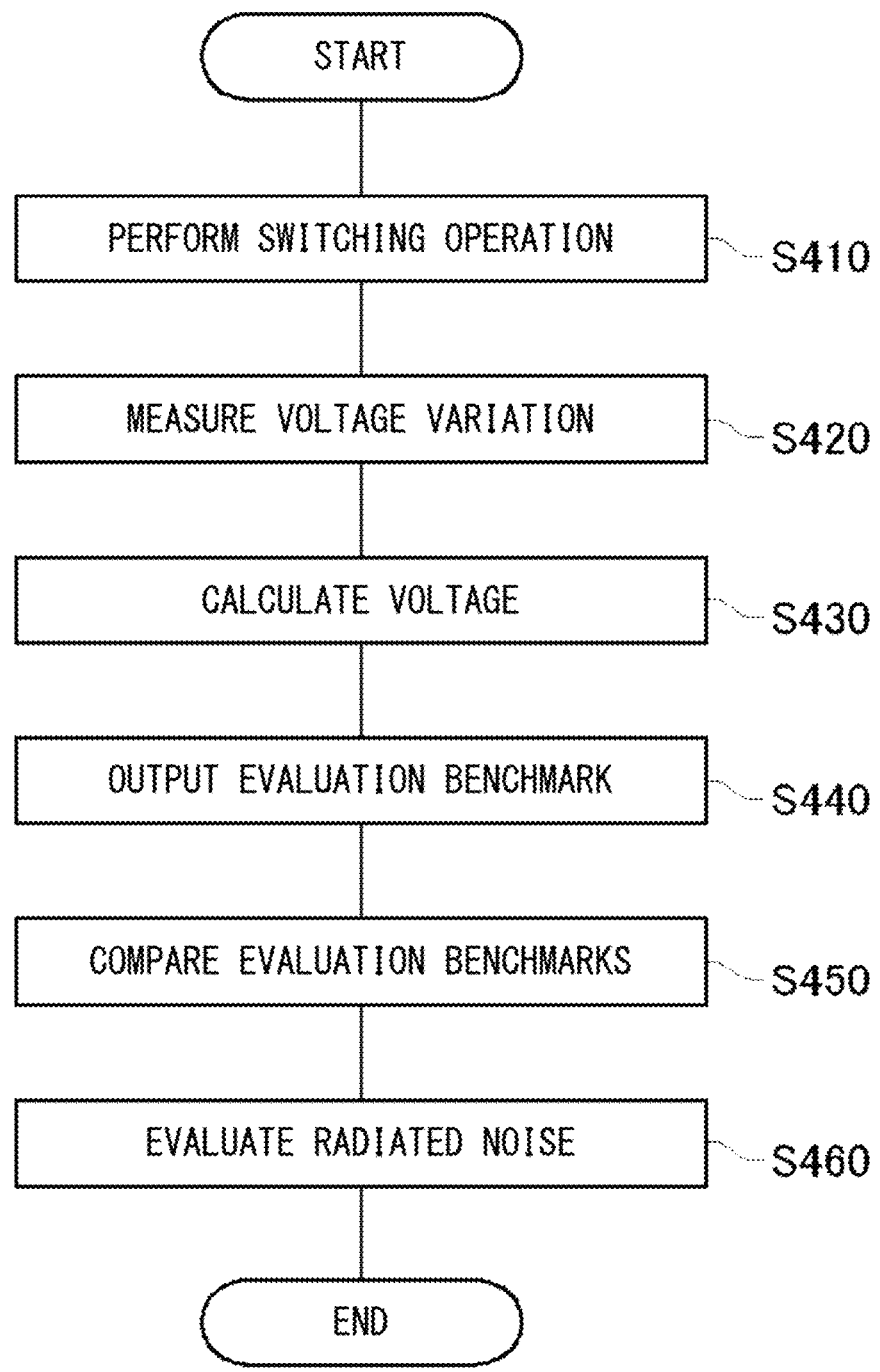
FIG. 4 shows an operation flow of the evaluation apparatus 200 according to the present embodiment.

FIG. 4 shows an operation flow of the evaluation apparatus 200 according to the present embodiment. The evaluation apparatus 200 executes operations of S410 to S460 shown in FIG. 4 to evaluate the radiated noise of the to-be-evaluated semiconductor device 10.

First, the semiconductor device 10, to which the voltage probes of the detection unit 220 are electrically connected, is caused to perform a switching operation (S410). For example, the signal supplying unit 150 causes the semiconductor device 10 to perform the switching operation, in accordance with the conditions set by the driving condition setting unit 210. For example, the signal supplying unit 150 supplies the switching signal $V_S$ shown in FIG. 2 to the gate terminal of the second device 14a and supplies an off-signal to the gate terminal of the first device 12a, thereby causing switching operations such as a forward recovery operation and a reverse recovery operation of the first device 12 and a turn-on operation and a turn-off operation of the second device 14. In the meantime, as described above, the signal supplying unit 150 is connected also to the gate terminals of the third device 12b to the sixth device 14c, and supplies any one signal of Case 1 to Case 9 in Table 1 to each gate terminal, in accordance with the conditions set by the driving condition setting unit 210.

TABLE 1

|        | Third Device | Fourth Device | Fifth Device | Sixth Device |
|--------|--------------|---------------|--------------|--------------|
| Case 1 | Off signal   | Off signal    | Off signal   | Off signal   |
| Case 2 | Vs           | Off signal    | Vs           | Off signal   |
| Case 3 | Vs           | Off signal    | Off signal   | Vs           |
| Case 4 | Off signal   | Vs            | Vs           | Off signal   |
| Case 5 | Off signal   | Vs            | Off signal   | Vs           |
| Case 6 | Off signal   | Off signal    | Vs           | Off signal   |
| Case 7 | Off signal   | Off signal    | Off signal   | Vs           |
| Case 8 | Vs           | Off signal    | Off signal   | Off signal   |
| Case 9 | Off signal   | Vs            | Off signal   | Off signal   |

The detection unit 220 detects voltage variation in the second series circuit 10b of the semiconductor device 10 during the switching operation of the semiconductor device 10 (S420). In this case, the detection unit 220 may detect voltage variation occurring between the third device 12b and the fourth device 14b, or voltage variation occurring in at least one of the third device 12b and the fourth device 14b. Also, the detection unit 220 may detect voltage variation in the third series circuit 10c of the semiconductor device 10. In this case, the detection unit 220 may detect voltage variation occurring between the fifth device 12c and the sixth device 14c or voltage variation occurring in at least one of the fifth device 12c and the sixth device 14c. Also, the detection unit 220 may detect voltage variation in the first series circuit 10c of the semiconductor device 10. In this case, the detection unit 220 may detect voltage variation occurring between the first device 12a and the second device 14a or voltage variation occurring in at least one of the first device 12a and the second device 14a.

In the meantime, switching operations of the semiconductor include an ON operation of IGBT, an OFF operation of IGBT, a forward recovery operation of a diode and a reverse recovery operation of a diode. Since the reverse recovery operation is fast in terms of operating speed, it has a high influence on the radiated noise in a frequency band of 10 MHz or higher, particularly. The reverse recovery occurs when an ON command of the semiconductor device is issued, i.e., the switching signal $V_S$ is applied to the gate terminal of the switching element. Therefore, it is preferable to acquire data in a form including a voltage at the time of the reverse recovery.

Also, the voltages of the plurality of devices may be measured at the same time. Also, a calculation result using the plurality of measured values may be detected. For example, in a frequency band of about 10 MHz or lower, the high radiated noise tends to occur in a state in which IGBT is off. Therefore, when evaluating the radiated noise in the frequency band, it is preferable to obtain data including time at which IGBT is off.

In the description above, the example in which the second device 14a is caused to perform the switching operation is described. However, the other devices such as the first device 12a, the third device 12b, the fourth device 14b, the fifth device 12c and the sixth device 14c may be caused to perform the switching operation.

Next, frequency components of the voltage variation are calculated (S430). For example, the evaluation benchmark output unit 230 calculates the frequency components by performing frequency conversion on the voltage variation in the semiconductor device 10 detected by the detection unit 220, that is, on a voltage waveform thereof. The evaluation benchmark output unit 230 may include a device for frequency domain measurement such as a spectrum analyzer, and observe the frequency components of the voltage variation.

Next, an evaluation benchmark for the radiated noise is output based on the voltage variation (S440). For example, the evaluation benchmark output unit 230 outputs calculated frequency characteristics of the voltage variation, as an evaluation benchmark for the radiated noise. The evaluation benchmark is a calculation result of frequency characteristics in a predetermined frequency band such as from 30 MHz to 1 GHz, as an example. The evaluation benchmark output unit 230 outputs the evaluation benchmark to the storage unit 240 for its storage. Also, the evaluation benchmark output unit 230 supplies the evaluation benchmark to the comparison unit 250. The evaluation benchmark output unit 230 may output the evaluation benchmark, as a part of the data sheet for the semiconductor device 10.

Next, the evaluation benchmark output for the semiconductor device 10 and an evaluation benchmark previously output for a reference device different from the semiconductor device 10 are compared (S450). For example, the comparison unit 250 reads out the previous evaluation benchmark from the storage unit 240, and compares the evaluation benchmark output by the evaluation benchmark output unit 230 and the previous evaluation benchmark. The comparison unit 250 calculates a differential spectrum between the evaluation benchmarks in a predetermined frequency band, as an example.

Next, a relative change in intensity of the radiated noise of the semiconductor device 10 is evaluated based on the comparison result (S460). For example, the evaluation unit 260 may use the differential spectrum, as the relative change in intensity. Also, the evaluation unit 260 may use a value in the differential spectrum corresponding to a predetermined frequency, as the relative change in intensity. Also, the evaluation unit 260 may use an average value of values in the differential spectrum corresponding to a plurality of predetermined frequencies, as the relative change in intensity.

The evaluation unit 260 outputs the relative change in intensity, as an evaluation result. The evaluation unit 260 may output the evaluation result for each type of the switching operations of the semiconductor device 10. As an example, in a case in which the reference device is a device with which an apparatus or the like has previously been equipped, the relative change in intensity will be a benchmark for a relative change in radiated electric field strength caused due to the equipment of the apparatus or the like with the semiconductor device 10. Also, in a case in which the reference device is substantially the same as the semiconductor device 10, the relative change in intensity will be a benchmark for manufacturing variability or change over time of the devices, difference between structures in which the devices are implemented, or the like.

The evaluation apparatus 200 according to the present embodiment can evaluate the radiated noise of the semiconductor device 10 and output the evaluation result by the above operation flow. While the example has been described above in which the evaluation apparatus 200 outputs the relative change in intensity, which is the difference from a previous evaluation benchmark, as the evaluation result, the present invention is not limited thereto. For example, the evaluation apparatus 200 may output an evaluation benchmark indicating an absolute frequency spectrum calculated by the evaluation benchmark output unit 230. In a case in which the evaluation apparatus 200 is an apparatus for outputting the evaluation benchmark, the comparison unit 250 and the evaluation unit 260 may be omitted.

Figure 5:
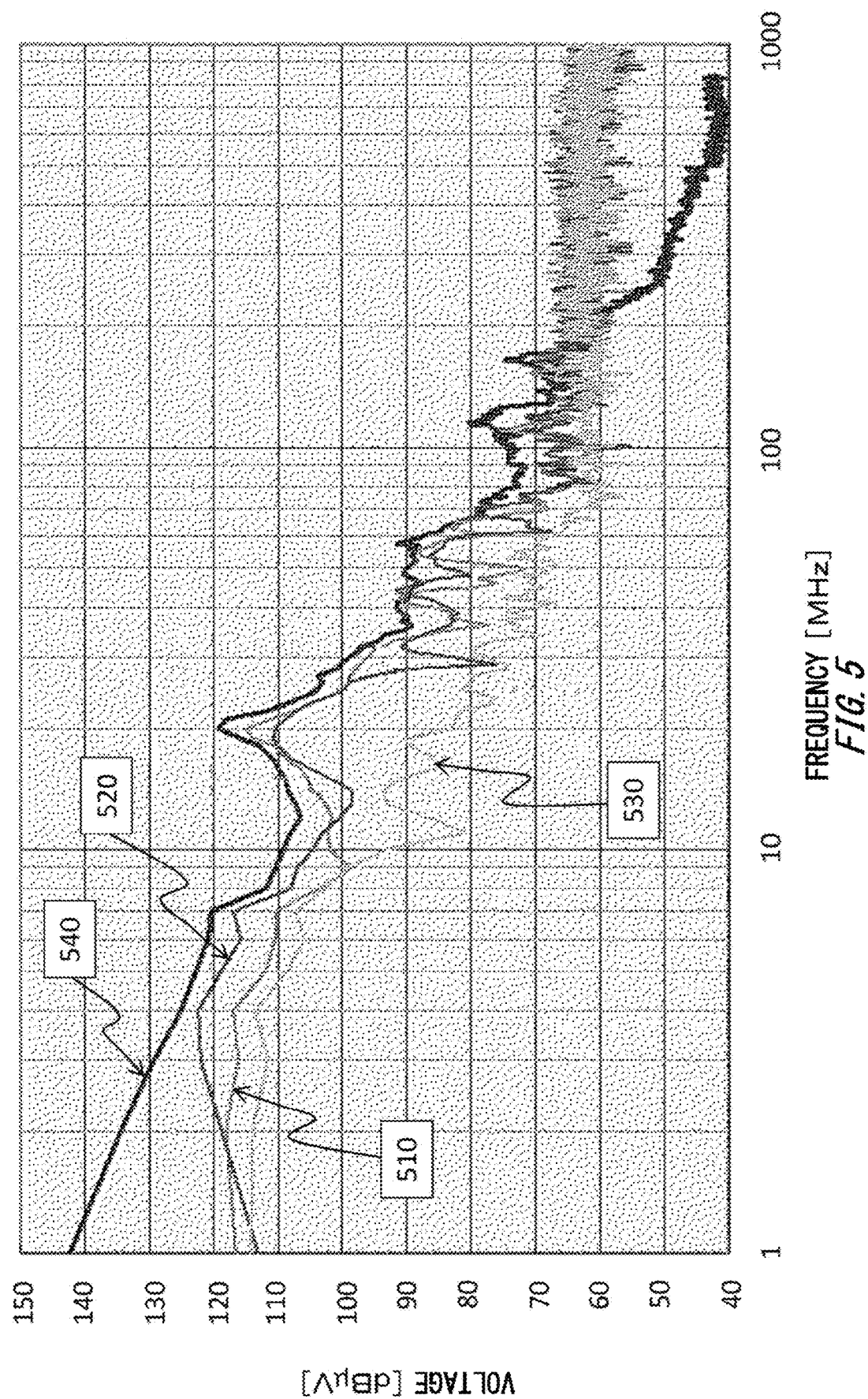
FIG. 5 shows an example of a voltage ($V_{ce}$) between collector and emitter terminals output by an evaluation benchmark output unit 230 of the present embodiment.

FIG. 5 shows an example of the voltage ($V_{ce}$) between the collector and emitter terminals output by the evaluation benchmark output unit 230 of the present embodiment. In FIG. 5, the vertical axis indicates the voltages [dBµV] between the collector and emitter terminals, and the horizontal axis indicates frequencies [MHz] in a band ranging from 1 MHz to 1 GHz. In FIG. 5, a waveform 510 indicates the voltages between the collector and emitter terminals of the third device 12b when the switching signal $V_S$ is supplied to the gate terminal of the second device 14a, the off signal is supplied to the gate terminal of the first device 12a and the signal of Case 1 in Table 1 is supplied to each of the gate terminals of the third device 12b to the sixth device 14c. A waveform 520 indicates the voltages between the collector and emitter terminals of the first device 12a in the same conditions. A waveform 530 indicates the voltages between the collector and emitter terminals of the second device 14a in the same conditions. A waveform 540 indicates maximum values of voltages measured between the collector and the emitter when the semiconductor device 10 is operated in diverse conditions with being equipped to the inverter. As described later, the frequency component converted from the switching waveform of the semiconductor device 10 and the radiated noise are correlated. Therefore, when characteristics closer to the waveform 540 are obtained, radiated noise closer to the actual radiated noise can be estimated. Here, the waveform 510 is the voltages between the collector and emitter terminals of the third device 12b, and there is no element that is switching in a leg thereof. However, in the vicinity of 20 MHz, characteristics, which have voltages higher than the waveform 520 of the first device 12a and the waveform 530 of the second device 14a of legs in which an element being switching is included and are closer to the waveform 540 indicative of measurement values when equipped to the inverter, can be obtained. This is caused due to an influence of a small circuit such as an unintended stray capacitance generated in the vicinity of the device. According to the evaluation apparatus 200 of the present embodiment, it is possible to evaluate the radiated noise of the device more accurately and to output an evaluation result by evaluating the voltage variation in the leg with no element being switching. As to measures against noise, it is very important to perceive a high peak occurring in the vicinity of 20 MHz of FIG. 5, for example. By using the present benchmark, it is possible to implement more effective measures against noise.

Figure 6:
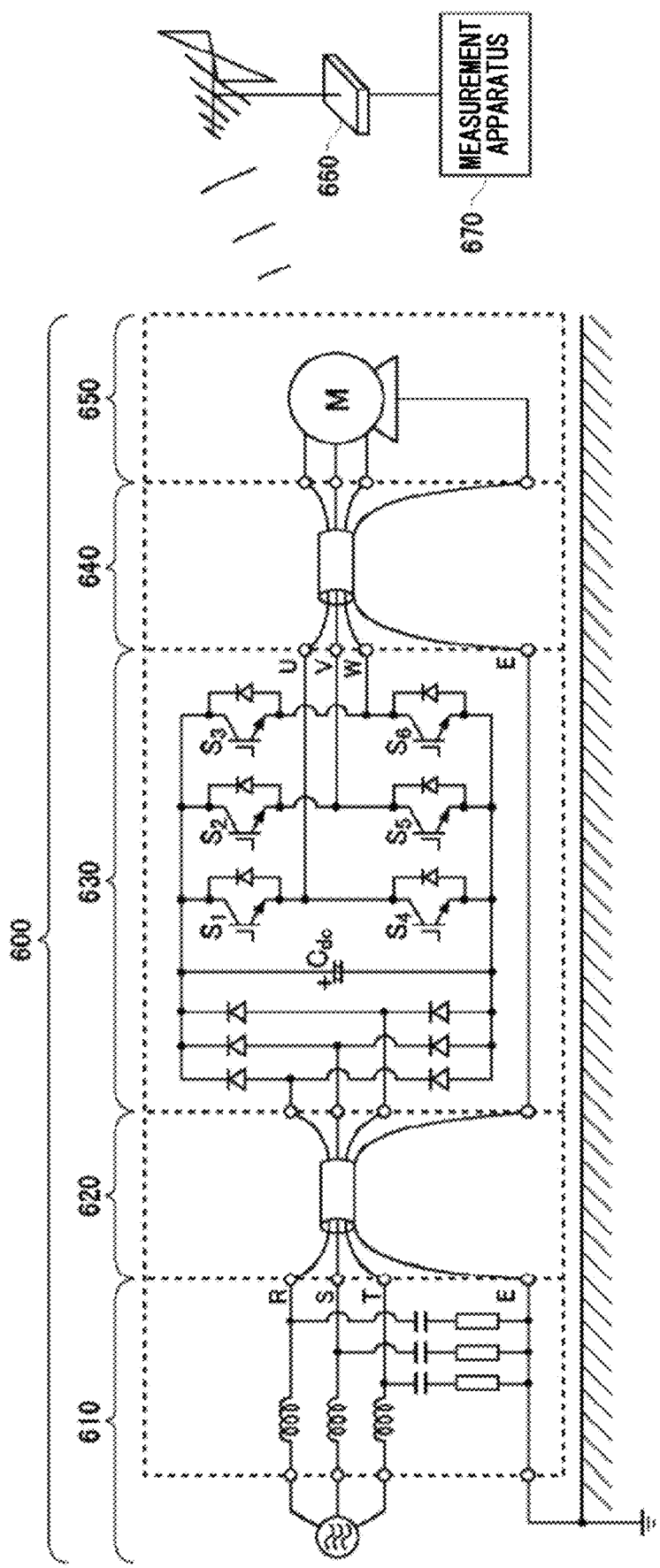
FIG. 6 shows a configuration example of a measurement system for measuring radiated noise of a motor-driving apparatus 600 equipped with the semiconductor device 10 according to the present embodiment.

FIG. 6 shows a configuration example of a measurement system for measuring radiated noise of a motor-driving apparatus 600 equipped with the semiconductor device 10 according to the present embodiment. The motor-driving apparatus 600 is an example of an apparatus equipped with the semiconductor device 10. The motor-driving apparatus 600 includes a power supply unit 610, an input cable 620, a driving circuit 630, an output cable 640, and a motor 650.

The power supply unit 610 is an AC power supply. The power supply unit 610 may include a line impedance stabilization network (LISN). The input cable 620 is configured to transmit AC voltage output by the power supply unit 610 to the driving circuit 630. The driving circuit 630 is configured to generate electrical signals for driving the motor 650. For example, the driving circuit 630 is configured to rectify the AC voltage of the power supply unit 610 by a rectification circuit, to supply the rectified signal to an inverter circuit, and to generate the electrical signals. The output cable 640 is configured to transmit the electrical signals output by the driving circuit 630 to the motor 650. The motor 650 is configured to rotate according to the electrical signals.

The driving circuit 630 of the motor-driving apparatus 600 as described above is equipped with the semiconductor device 10 according to the present embodiment. In FIG. 6, a device $S_1$ is the first device 12a and a device $S_4$ is the second device 14a, for example. Also, a device $S_2$ may be the first device 12a and a device $S_5$ may be the second device 14a. Also, a device $S_3$ may be the first device 12a and a device $S_6$ may be the second device 14a. The semiconductor device 10 may be equipped as a part of the inverter circuit of the driving circuit 630. The semiconductor device 10 performs switching operations according to electrical signals, and thus generates radiated noise as a result of these operations.

An antenna 660 and a measurement apparatus 670 are configured to measure such radiated noise. The antenna 660 is configured to receive radiated noise propagated through space. The antenna 660 is arranged in a position spaced at a predetermined distance from the motor-driving apparatus 600. The measurement apparatus 670 is configured to receive the signal received by the antenna 660, and to convert the received signal into a frequency domain for output. The measurement apparatus 670 may be configured to measure a higher frequency region than a rotation frequency of the motor 650. The measurement apparatus 670 may be a spectrum analyzer or the like.

Figure 7:
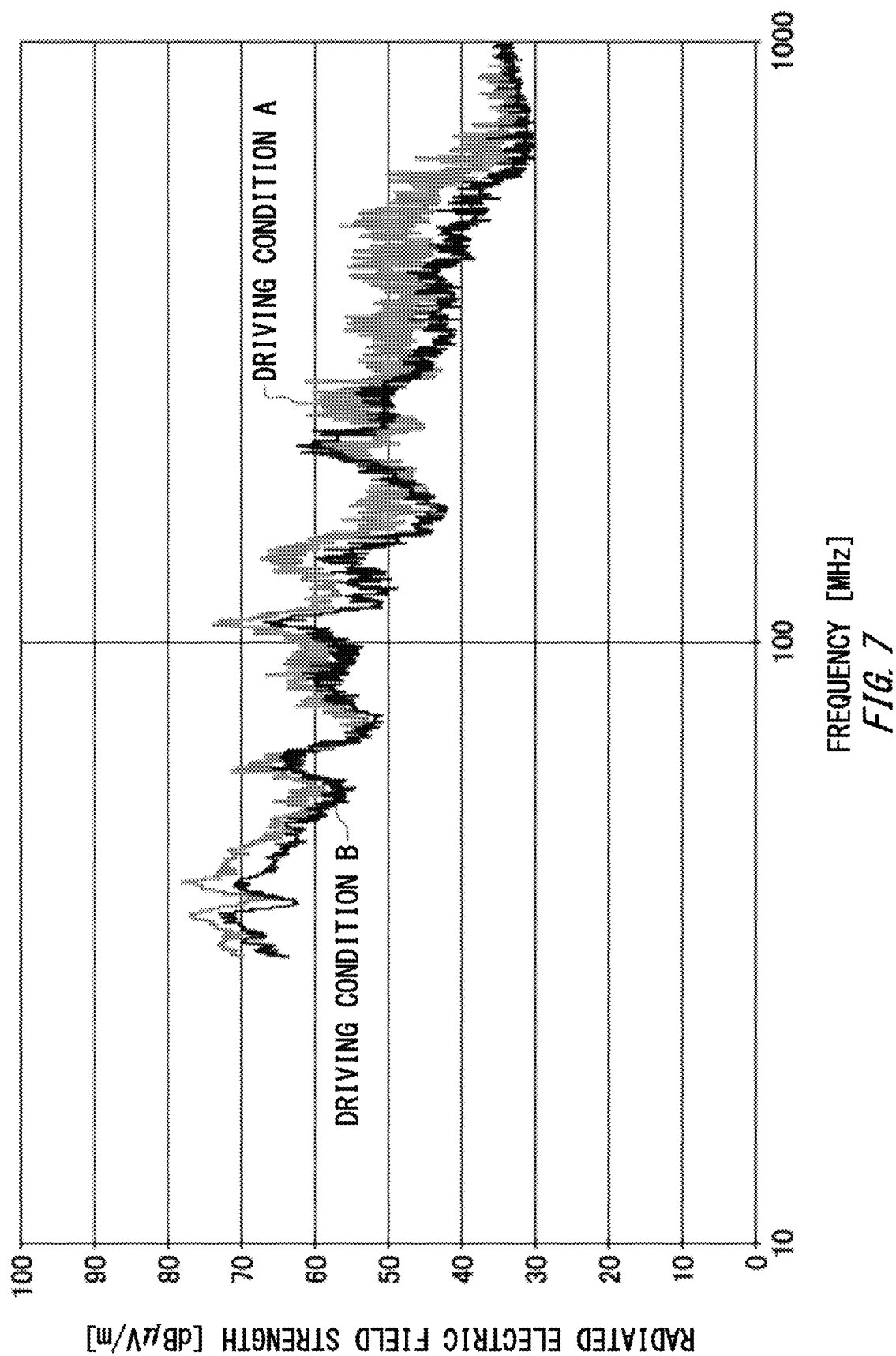
FIG. 7 shows an example of the radiated noise measured by the measurement system shown in FIG. 6.

FIG. 7 shows an example of the radiated noise measured by the measurement system shown in FIG. 6. FIG. 7 shows radiated noise observed when the semiconductor device 10 is driven under two different conditions. For example, it can be seen that, when the driving condition of the semiconductor device 10 is changed from driving condition A to driving condition B, the radiated electric field strength in a frequency region from 30 MHz to 100 MHz is reduced by about 2 dB to 6 dB.

Figure 8:
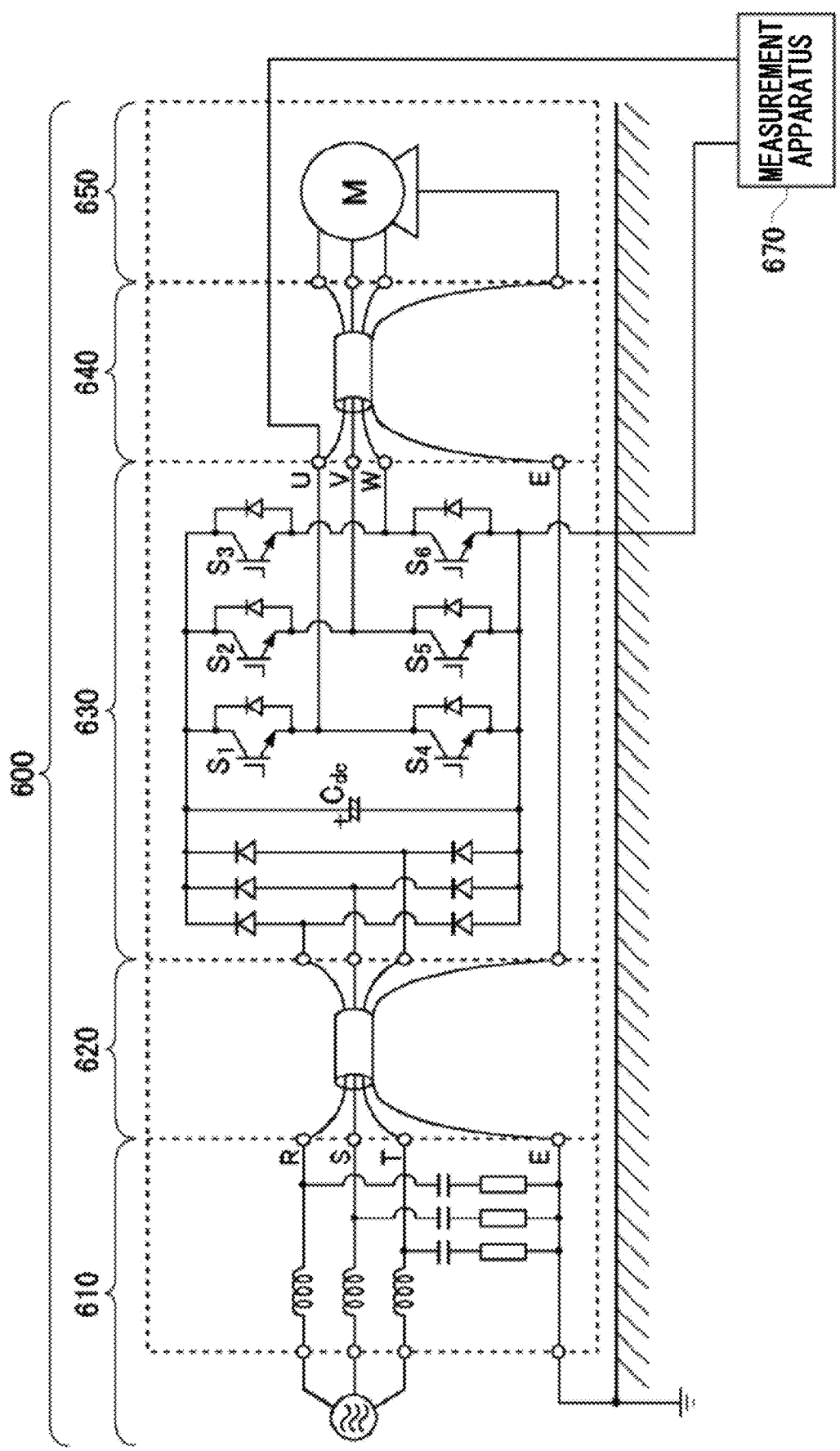
FIG. 8 shows a configuration example of a measurement system for measuring motor-driving electrical signals of the motor-driving apparatus 600 equipped with the semiconductor device 10 according to the present embodiment.

FIG. 8 shows a configuration example of a measurement system for measuring motor-driving electrical signals of the motor-driving apparatus 600 equipped with the semiconductor device 10 according to the present embodiment. In the measurement system shown in FIG. 8, the elements that operate in substantially the same manner as those in the measurement system shown in FIG. 6 are denoted with the same reference signs, and the descriptions thereof are omitted. The motor-driving apparatus 600 is substantially the same as the apparatus equipped with the semiconductor device 10 shown in FIG. 6.

In FIG. 8, the measurement apparatus 670 is configured to measure electrical signals for driving the motor 650 output by the driving circuit 630. The measurement apparatus 670 is configured to measure a switching voltage waveform of the semiconductor device 10 while the motor 650 is driven by the motor-driving apparatus 600.

Figure 9:
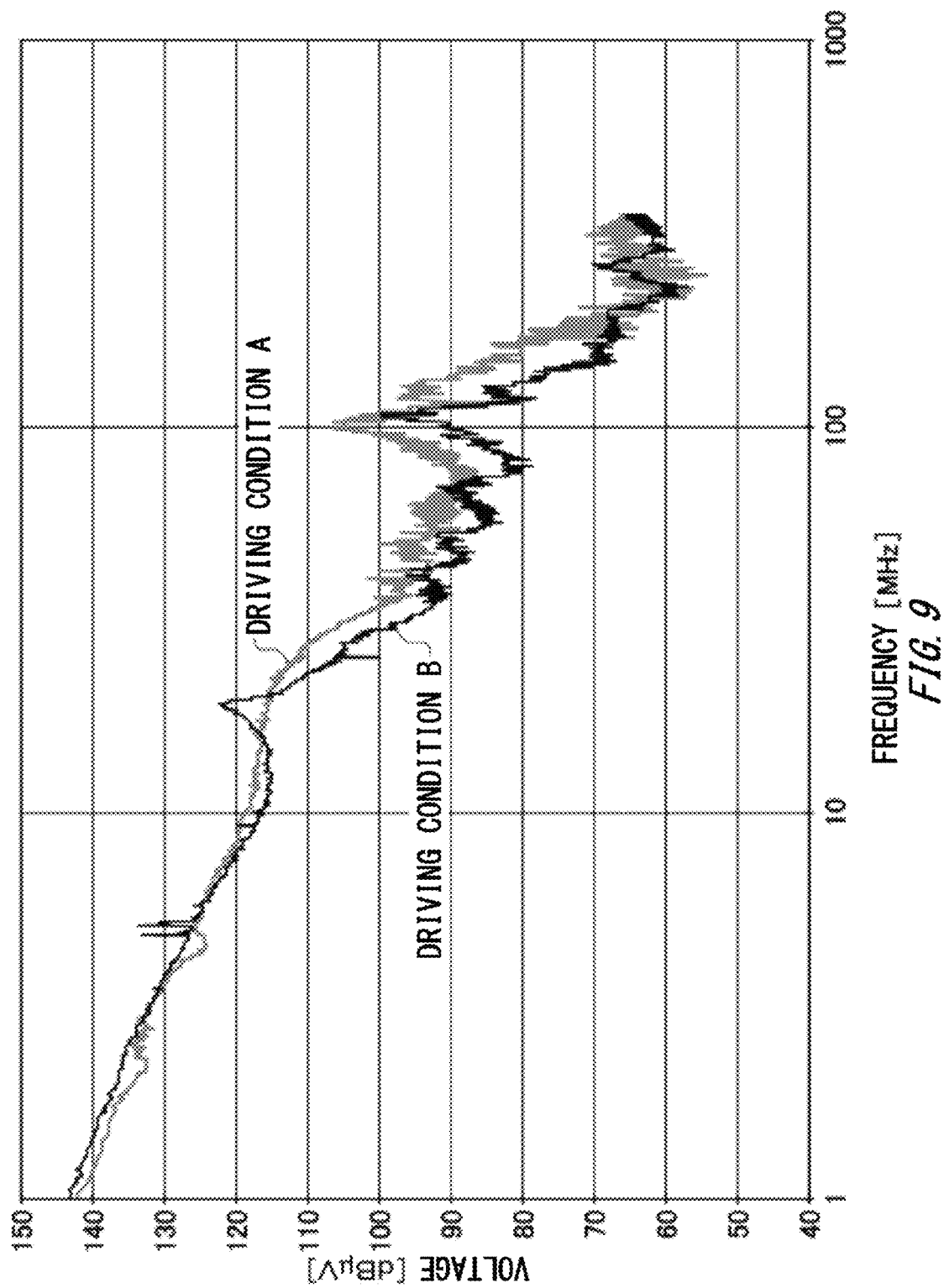
FIG. 9 shows a result obtained by measuring the voltages ($V_{ce}$) between the collector and emitter terminals of the device upon measurement of the radiated noise shown in FIG. 7 by means of the measurement system shown in FIG. 8 and performing frequency analysis.

FIG. 9 shows a result obtained by measuring the voltages ($V_{ce}$) between the collector and emitter terminals of the device upon measurement of the radiated noise shown in FIG. 7 by means of the measurement system shown in FIG. 8 and performing frequency analysis. For example, it can be seen that, when the driving condition of the semiconductor device 10 is changed from driving condition A to driving condition B, the radiated electric field strength in a frequency region from 30 MHz to 100 MHz tends to be reduced by about 2 dB to 6 dB.

Comparing the measurement results from FIG. 7 and FIG. 9, it can be confirmed that the relative change values before and after the change between driving condition A and driving condition B show similar tendencies, for example in a frequency region of 30 MHz to 500 MHz. That is, it can be seen that the frequency components converted from the switching waveform of the semiconductor device 10 and the radiated noise are correlated, and thus relative values of the radiated noise can be perceived based on the switching waveform of the semiconductor device 10. Also, it can be seen that, by measuring this correlation in advance, the radiated electric field strength of the radiated noise can be perceived based on the switching waveform of the semiconductor device 10.

Also, as described above, the maximum values of the voltage values measured between the collector and the emitter when operated under diverse driving conditions by the measurement system shown in FIG. 8 are the waveform 540 shown in FIG. 5. Therefore, according to the evaluation apparatus 200 of the present embodiment, it is possible to evaluate an amount of generated noise for each type of switching characteristics by analyzing the voltage variation of the device indicative of characteristics close to the waveform 540, i.e., the voltage variation in the leg with no element being switching.

The evaluation apparatus 200 according to the present embodiment evaluates the radiated noise based on the frequency characteristics of the switching voltage waveforms obtained by causing the semiconductor device 10 to perform the turn-on operation, turn-off operation, reverse recovery operation, and forward recovery operation. The frequency characteristics of the switching voltage waveforms obtained in correspondence with the turn-on operation, turn-off operation, reverse recovery operation, and forward recovery operation are referred to as turn-on characteristics, turn-off characteristics, reverse recovery characteristics, and forward recovery characteristics, respectively.

As shown in FIG. 5, the results of the frequency characteristics of the switching voltage waveforms obtained by the evaluation apparatus 200 are different in voltage depending on the type of the switching operation. In particular, the reverse recovery characteristics may have higher voltage than the others at frequencies of 30 MHz or higher, which is subject to the regulations of radiated noise. Therefore, it is preferable for the evaluation apparatus 200 to perform switching operations including at least the reverse recovery operation of the semiconductor device 10, thereby outputting the evaluation benchmarks.

Furthermore, when at least two of the four types of characteristics are known, the other types of characteristics may be estimated by analogy. Therefore, it is preferable for the evaluation apparatus 200 to perform switching operations including at least two of the turn-on operation, turn-off operation, reverse recovery operation, and forward recovery operation of the semiconductor device, thereby outputting the evaluation benchmarks. In this case, it is more preferable that one of the at least two operations is the reverse recovery operation.

In addition, the turn-on characteristics of the four types of characteristics may have the next highest voltage after the reverse recovery characteristics than the others. Therefore, it is more preferable for the evaluation apparatus 200 to perform switching operations including at least the reverse recovery operation and turn-on operation of the semiconductor device 10, thereby outputting the evaluation benchmarks. As described above, the signal supplying unit 150 may be configured to supply a switching signal to cause the semiconductor device 10 to perform one or at least two of the turn-on operation, turn-off operation, reverse recovery operation and forward recovery operation. In this manner, the evaluation apparatus 200 can shorten the time for evaluation and reduce the trouble for evaluation or the like.

The example has been described above in which the evaluation apparatus 200 according to the present embodiment observes the voltage variation between the third device 12b and the fourth device 14b connected in series and the voltage variation between the fifth device 12c and the sixth device 14c connected in series. Additionally or alternatively, the evaluation apparatus 200 may be configured to observe the voltage variation between the first device 12a and the third device 12b, the voltage variation between the first device 12a and the fifth device 12c and the voltage variation between the third device 12b and the fifth device 12c. The voltages correspond to output voltages of a bridge circuit, and are a waveform considering an influence of the small circuit around the device, too. The evaluation apparatus 200 may be configured to evaluate the radiated noise of the semiconductor device 10 by observing the high-frequency fluctuation component.

Additionally or alternatively, the evaluation apparatus 200 may be configured to observe the voltage variation in at least one of the first device 12a and the second device 14a, in at least one of the third device 12b and the fourth device 14b or in at least one of the fifth device 12c and the sixth device 14c. That is, the detection unit 220 is electrically connected to one end of the first device 12a and the other end of the second device 14a, and is configured to detect the variation in voltage across the first device 12a and the second device 14a.

The voltage across the first device 12a to the sixth device 14c has a waveform in which a high-frequency fluctuation component $\Delta V_{DC}$ due to switching operations is superimposed on the DC voltage $V_{DC}$ supplied by the power supply 110. The evaluation apparatus 200 may be configured to evaluate the radiated noise of the semiconductor device 10 by observing the high-frequency fluctuation component $\Delta V_{DC}$.

In the meantime, when the high-frequency fluctuation component $\Delta V_{DC}$ is observed by causing the semiconductor device 10 to perform the turn-on operation, voltage variation is observed in which the reverse recovery characteristics of the first device 12a and the turn-on characteristics of the second device 14a are superimposed. That is, in this case, the high-frequency fluctuation component $\Delta V_{DC}$ is correlated with the characteristics having higher voltage of the reverse recovery characteristics of the first device 12a and the turn-on characteristics of the second device 14a.

Similarly, when the high-frequency fluctuation component $\Delta V_{DC}$ is observed by causing the semiconductor device 10 to perform the turn-off operation, voltage variation is observed in which the forward recovery characteristics of the first device 12a and the turn-off characteristics of the second device 14a are superimposed. That is, in this case, the high-frequency fluctuation component $\Delta V_{DC}$ is correlated with the characteristics having higher voltage of the forward recovery characteristics of the first device 12a and the turn-off characteristics of the second device 14a.

Therefore, the evaluation apparatus 200 can observe the two switching characteristics having higher voltage among the four switching characteristics by, for example, causing the semiconductor device 10 to perform the turn-on operation and the turn-off operation and observing the high-frequency fluctuation component $\Delta V_{DC}$ one time for each operation. Also, the measurement of the high-frequency fluctuation component $\Delta V_{DC}$ is the observation of frequency characteristics excluding the DC component, and therefore the $\Delta V_{DC}$ component can be easily extracted by performing measurement using AC coupling or inserting a high-pass filter between the detection unit 220 and the evaluation benchmark output unit 230. Therefore, the evaluation apparatus 200 can measure the high-frequency fluctuation component $\Delta V_{DC}$ with increased S/N ratio and dynamic range.

As described above, the evaluation apparatus 200 according to the present embodiment observes voltage variation in the semiconductor device 10 during switching operations. Here, current flowing in a stray capacitance of the semiconductor device 10 may act as a source of radiated noise. For example, when cooling fins are attached to the semiconductor device 10, a stray capacitance is formed between a conductive member as a part of the cooling fins and the semiconductor device 10, and current flowing in the stray capacitance generates radiated noise.

In this case, the evaluation apparatus 200 can perform relative evaluation of radiated noise more accurately by acquiring an observation result in which the noise generated due to the stray capacitance is added. Such an evaluation apparatus 200 is described as follows.

Figure 10:
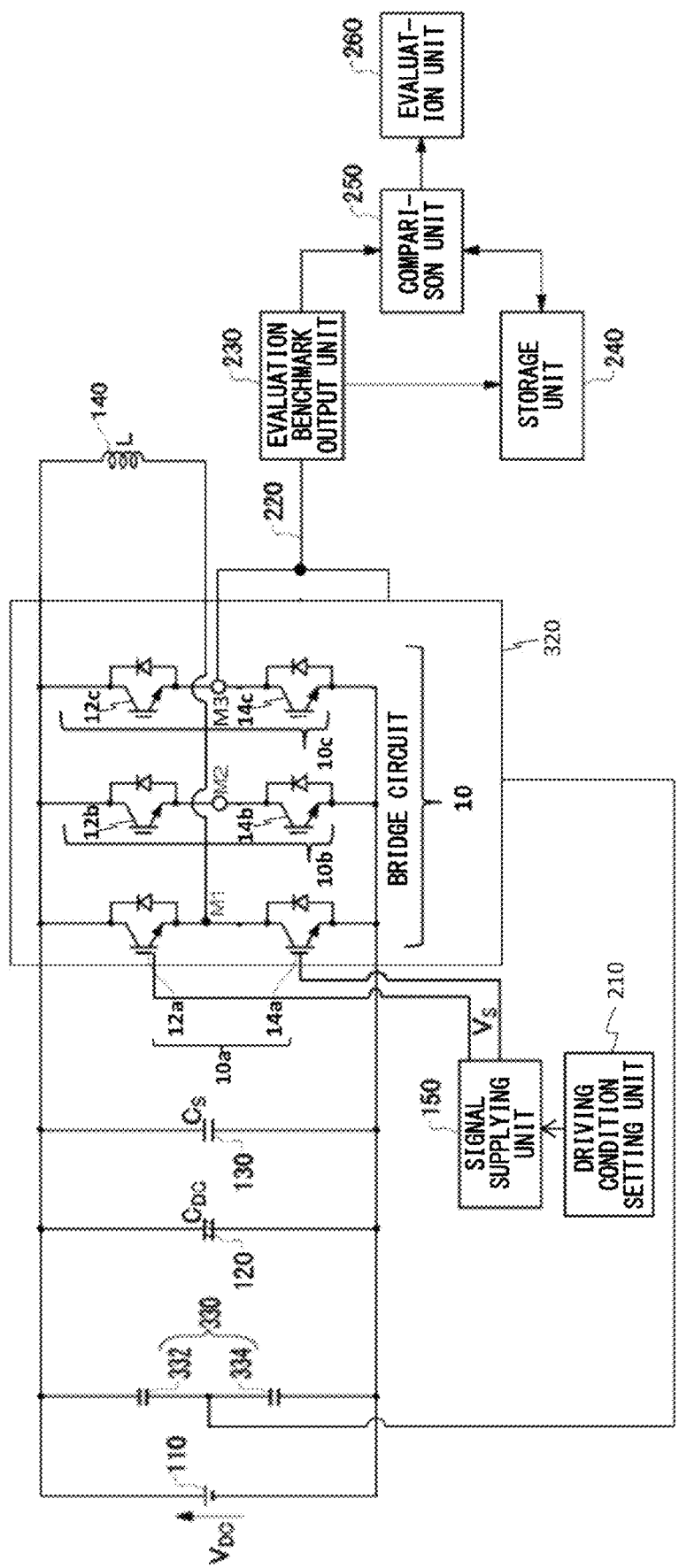
FIG. 10 shows a modified example of the evaluation apparatus 200 according to the present embodiment.

FIG. 10 shows a modified example of the evaluation apparatus 200 according to the present embodiment. The elements of the evaluation apparatus 200 in the present modified example that operate in substantially the same manner as those of the evaluation apparatus 200 according to the present embodiment shown in FIG. 3 are denoted with the same reference signs, and the descriptions thereof are omitted. The evaluation apparatus 200 of the present modified example further includes a conductive member 320 and a third capacitive unit 330.

The conductive member 320 is a part of a temperature adjustment unit configured to adjust a temperature of the semiconductor device 10. For example, the conductive member 320 is a part of at least one of a heater, a cooling device, and heat dissipation fins.

Also, the conductive member 320 has a function of stably maintaining ambient temperatures of the semiconductor device 10. Therefore, it is preferable for the conductive member 320 to be directly fixed to the semiconductor device 10. In this manner, a stray capacitance and a contact resistance between the semiconductor device 10 and the conductive member 320 can be maintained at substantially constant and stable values.

The evaluation apparatus 200 is configured to observe variation in voltage of the semiconductor device 10 relative to a reference potential, which is a potential of the conductive member 320 fixed to a substrate on which the semiconductor device 10 is arranged. For example, one of the voltage probes of the detection unit 220 is electrically connected to the conductive member 320 and the other is electrically connected between the first device 12a and the second device 14a, between the third device 12b and the fourth device 14b and between the fifth device 12c and the sixth device 14c, respectively, thereby detecting voltage variation in the collector terminals of the second device 14a, the fourth device 14b and the sixth device 14c, i.e., in the emitter terminals of the first device 12a, the third device 12b and the fifth device 12c. Alternatively, one of the voltage probes of detection unit 220 may be electrically connected to the conductive member 320 and the other may be electrically connected to one ends of the first device 12a, the third device 12b and the fifth device 12c closer to the collector terminals or the emitters of the second device 14a, the fourth device 14b and the sixth device 14c, respectively, thereby detecting variation in voltage across the first device 12a and the second device 14a, variation in voltage across the third device 12b and the fourth device 14b or variation in voltage across the fifth device 12c and the sixth device 14c. That is, the detection unit 220 is configured to detect voltage variation occurring in at least one of between the connection of the first device 12a and second device 14a and the conductive member 320, between the connection of the third device 12b and fourth device 14b and the conductive member 320, between the connection of the fifth device 12c and sixth device 14c and the conductive member 320, between the collector terminal of the first device 12a and the conductive member 320, between the collector terminal of the third device 12b and the conductive member 320, between the collector terminal of the fifth device 12c and the conductive member 320, between the emitter terminal of the second device 14a and the conductive member 320, between the emitter terminal of the fourth device 14b and the conductive member 320, and between the emitter terminal of the sixth device 14c and the conductive member 320.

As described above, the evaluation apparatus 200 of the present modified example stabilizes the stray capacitance between the semiconductor device 10 and the conductive member 320. Since the conductive member 320 is used for temperature stabilization, it is preferable for its surface area to be larger, and its stray capacitance can be made greater than other paths. Also, the stray capacitance forms a path for common-mode current, which causes radiated noise. Therefore, the evaluation apparatus 200 can stabilize the noise generated due to the stray capacitance and the common-mode current, thereby outputting an evaluation benchmark with higher reproductivity.

Also, the evaluation apparatus 200 of the present modified example includes a plurality of capacitive units, each of which is connected parallel to the semiconductor device, and at least one of the plurality of capacitive units may include a plurality of capacitive elements connected in series. FIG. 10 shows an example of the evaluation apparatus 200 in which the third capacitive unit 330 includes a first capacitive element 332 and a second capacitive element 334. A point between the first capacitive element 332 and the second capacitive element 334 may be connected to a reference potential (not shown).

The third capacitive unit 330 is a known circuit used as an EMC filter for reducing radiated noise. Providing such a circuit allows the evaluation apparatus 200 to have a circuit configuration closer to that to be actually equipped with the semiconductor device 10, and to output an evaluation result with higher accuracy. In addition to the third capacitive unit 330, the evaluation apparatus 200 may be further provided with an EMC filter of the same type and/or a different type, or the like.

As described above, the evaluation apparatus 200 according to the present embodiment can evaluate the radiated noise of the semiconductor device 10 by causing the semiconductor device 10 to perform switching operations. However, when an apparatus or the like is actually equipped with the semiconductor device 10, the switching current of the semiconductor device 10 may vary momentarily. The amount of radiated noise varies with the switching current, and thus may have a different result than the evaluation benchmark output by the evaluation apparatus 200.

Figure 11:
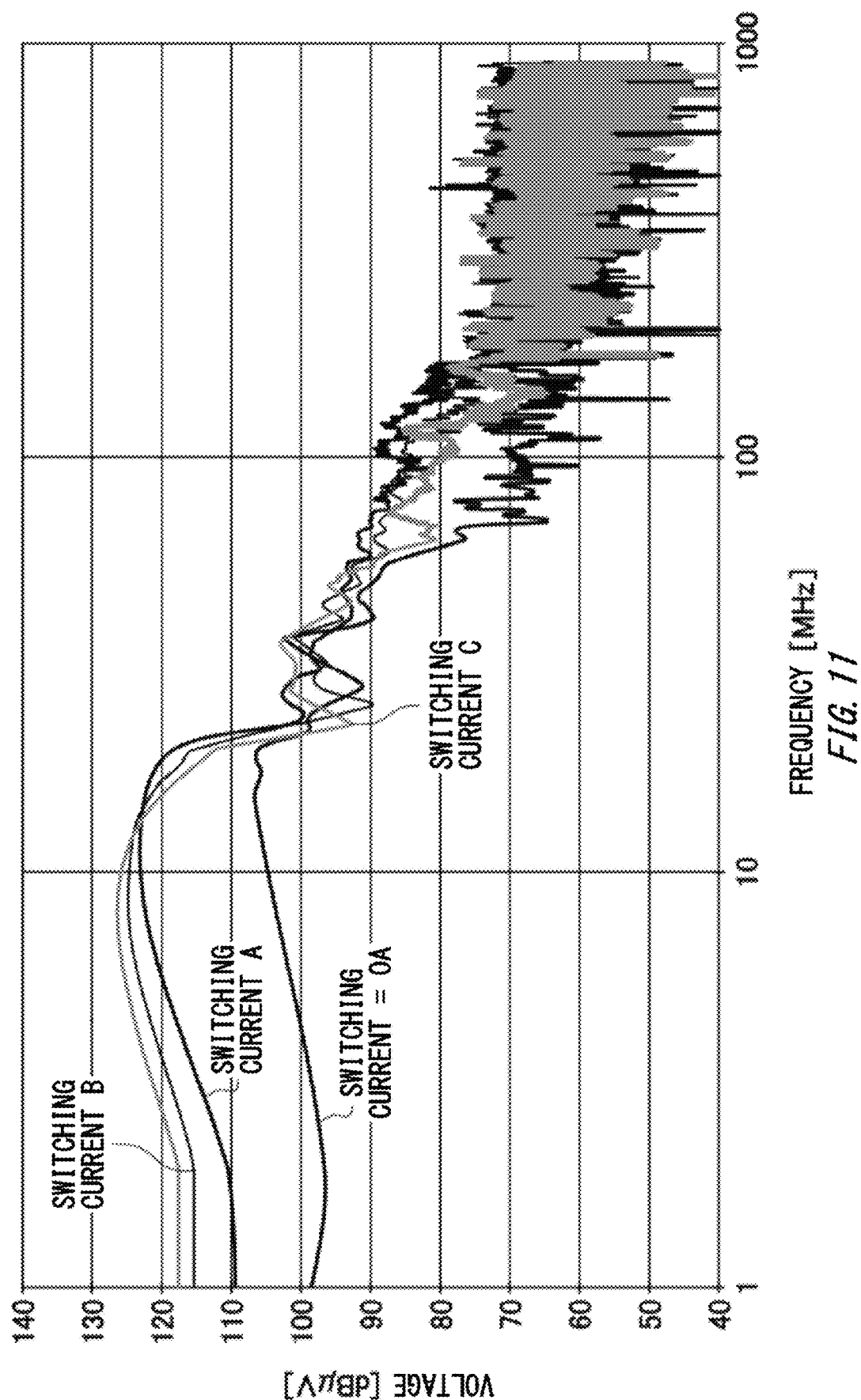
FIG. 11 shows an example of turn-on characteristics of the semiconductor device 10 output as an evaluation benchmark by the evaluation benchmark output unit 230 according to the present embodiment.

FIG. 11 shows examples of turn-on characteristics of the semiconductor device 10 output as evaluation benchmarks by the evaluation benchmark output unit 230 according to the present embodiment. The evaluation benchmark is the turn-on characteristics obtained by varying the switching current flowing in the semiconductor device 10 according to a plurality of switching signals $V_S$. FIG. 11 shows comparative turn-on characteristics for a switching current of 0 A, and three cases of turn-on characteristics corresponding to three predetermined values of switching current of $I_1$, $2I_1$, and $3I_1$.

Comparing these four waveforms, it can be seen that voltages are non-linear functions of switching current values. For example, the maximum values at different frequencies may correspond to different current conditions. As an example, the maximum value at 10 MHz corresponds to the switching current condition of $3I_1$, while the maximum value at 20 MHz corresponds to the switching current condition of h. Therefore, when the switching current of the semiconductor device 10 is changed, the radiated noise generated due to the switching current can be estimated by combining a plurality of evaluation benchmarks based on the change in the drive current. Such a combined evaluation apparatus 300 is described as follows.

Figure 12:
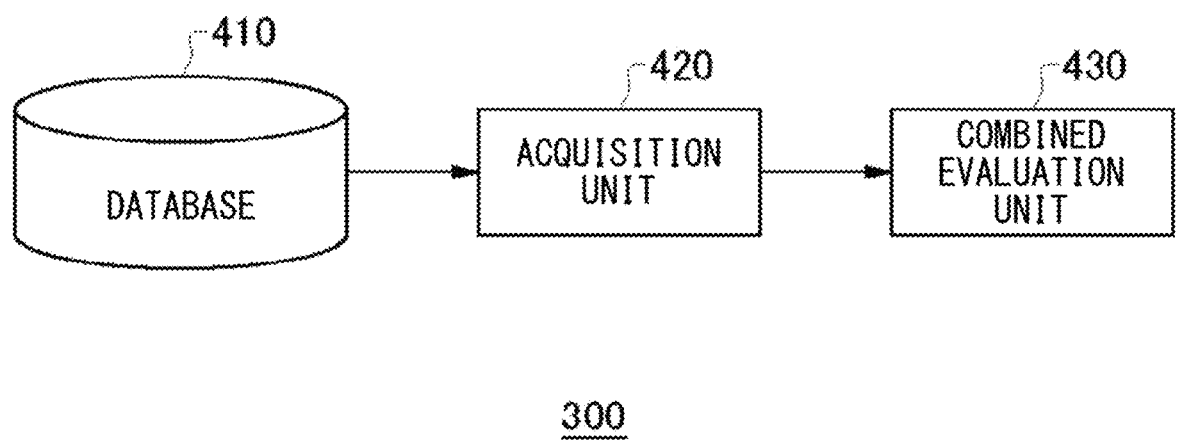
FIG. 12 shows a configuration example of a combined evaluation apparatus 300 in the present embodiment, together with a database 410.

FIG. 12 shows an example configuration of a combined evaluation apparatus 300 according to the present embodiment together with a database 410. The database 410 stores evaluation benchmarks output by the evaluation apparatus 200. It is desirable that the database 410 stores evaluation benchmarks output for a plurality of different switching operations of the semiconductor device 10, each of which is performed under a plurality of different conditions of the switching signal. The database 410 may be the storage unit 240 of the evaluation apparatus 200.

The combined evaluation apparatus 300 uses these evaluation benchmarks to perform combined evaluation on the radiated noise emitted by an apparatus provided with the semiconductor device 10. The apparatus equipped with the semiconductor device 10 as shown in FIG. 6 is referred to as an equipped apparatus. The combined evaluation apparatus 300 includes an acquisition unit 420 and a combined evaluation unit 430.

The acquisition unit 420 acquires a plurality of evaluation benchmarks for the semiconductor device 10 that are output by the evaluation apparatus 200 in correspondence with switching signals of a plurality of different conditions. For example, the acquisition unit 420 acquires the evaluation benchmarks from the database 410 via a network or the like. The acquisition unit 420 may also be directly connected to the database 410 to acquire the evaluation benchmarks. The acquisition unit 420 may also acquire information of a drive signal for driving the semiconductor device 10.

The combined evaluation unit 430 combines the plurality of evaluation benchmarks according to the drive signal for driving the semiconductor device 10, to perform combined evaluation on the radiated noise of the equipped apparatus. For example, the combined evaluation unit 430 calculates an evaluation result of the radiated noise by summing the voltages of the plurality of evaluation benchmarks corresponding to each of predetermined frequencies. The combined evaluation unit 430 may also calculate an evaluation result for the radiated noise by calculating the average value or maximum value of the voltages of the plurality of evaluation benchmarks corresponding to each of predetermined frequencies. The combined evaluation unit 430 outputs the calculated evaluation result.

Figure 13:
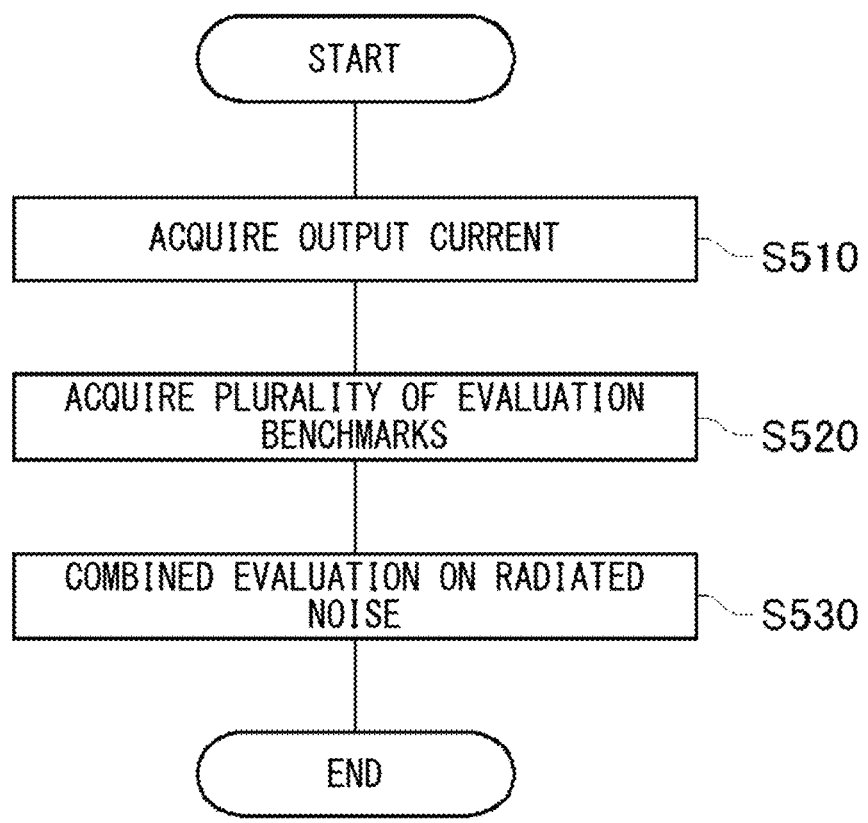
FIG. 13 shows an operation flow of the combined evaluation apparatus 300 according to the present embodiment.

FIG. 13 shows an operation flow of the combined evaluation apparatus 300 according to the present embodiment. The combined evaluation apparatus 300 performs the operations of S510 to S530 shown in FIG. 13 to perform combined evaluation on the radiated noise emitted by the semiconductor device 10 in the equipped apparatus.

First, a drive signal for driving the semiconductor device 10 is acquired (S510). The acquisition unit 420 acquires, from the database 410 or the like, information of the drive signal with which the equipped apparatus drives the semiconductor device 10. Alternatively, the acquisition unit 420 may be connected to the equipped apparatus to acquire information of the drive signal from the equipped apparatus. Alternatively, the acquisition unit 420 may receive information of the drive signal input by a user of the combined evaluation apparatus 300 such as a designer or user of the equipped apparatus.

Next, a plurality of evaluation benchmarks for the semiconductor device 10 that are output by the evaluation apparatus 200 in correspondence with switching operations under a plurality of different conditions are acquired (S520). The acquisition unit 420 acquires a combination of a plurality of evaluation benchmarks in correspondence with the drive signal of the semiconductor device 10. For example, the acquisition unit 420 acquires corresponding evaluation benchmarks according to the polarity, magnitude or the like of the drive signal. The acquisition unit 420 may also acquire corresponding evaluation benchmarks according to the temporal changes in the drive signal. The acquisition unit 420 may also calculate a plurality of evaluation benchmarks by multiplying the evaluation benchmarks by weights corresponding to the temporal changes in the drive signal.

Next, the combined evaluation unit 430 combines the plurality of evaluation benchmarks acquired by the acquisition unit 420 according to the drive signal for driving the semiconductor device 10, to perform combined evaluation on the radiated noise of the equipped apparatus (S530). For example, a combination of evaluation benchmarks used by the combined evaluation unit 430 is the maximum value or sum of the plurality of evaluation benchmarks for the semiconductor device 10. A combination of evaluation benchmarks used by the combined evaluation unit 430 may also be the average value of the plurality of evaluation benchmarks for the semiconductor device 10. A combination of evaluation benchmarks used by the combined evaluation unit 430 may also be the maximum value or sum and the average value of the plurality of evaluation benchmarks.

For example, the standards for radiated noise of electronic equipment such as defined by International Special Committee on Radio Interference (CISPR) are on the basis of quasi-peak values, average values and the like. Therefore, for compatibility with these standard values, the combined evaluation unit 430 may use the maximum value and average value of the plurality of evaluation benchmarks for combined evaluation of the radiated noise and output the evaluation result. In this case, for example, the quasi-peak value can be predicted to some extent based on the magnitude of the difference between the output maximum and average values, or the like.

A combination of evaluation benchmarks used by the combined evaluation unit 430 may also be the average value calculated after multiplying the plurality of evaluation benchmarks for the semiconductor device 10 by respective weights corresponding to the current output by the semiconductor device 10.

As described above, the combined evaluation apparatus 300 calculates an estimated value of the radiated noise by combining evaluation benchmarks that are accurately evaluated in advance according to the drive signal for driving the semiconductor device 10, and thus can perform combined evaluation on the radiated noise. The combined evaluation apparatus 300 according to the present embodiment acquires and combines evaluation benchmarks corresponding to the output current and switching current at the time of incorporation of the semiconductor device 10 into an apparatus from among a plurality of evaluation benchmarks obtained by observing and evaluating voltage variation in the semiconductor device 10 due to switching operations under various conditions. Thus, the combined evaluation apparatus 300 can use evaluation benchmarks obtained by evaluating respective values of radiated noise corresponding to the voltage variation in the semiconductor device 10, and therefore can estimate the radiated noise more accurately.

Figure 14:
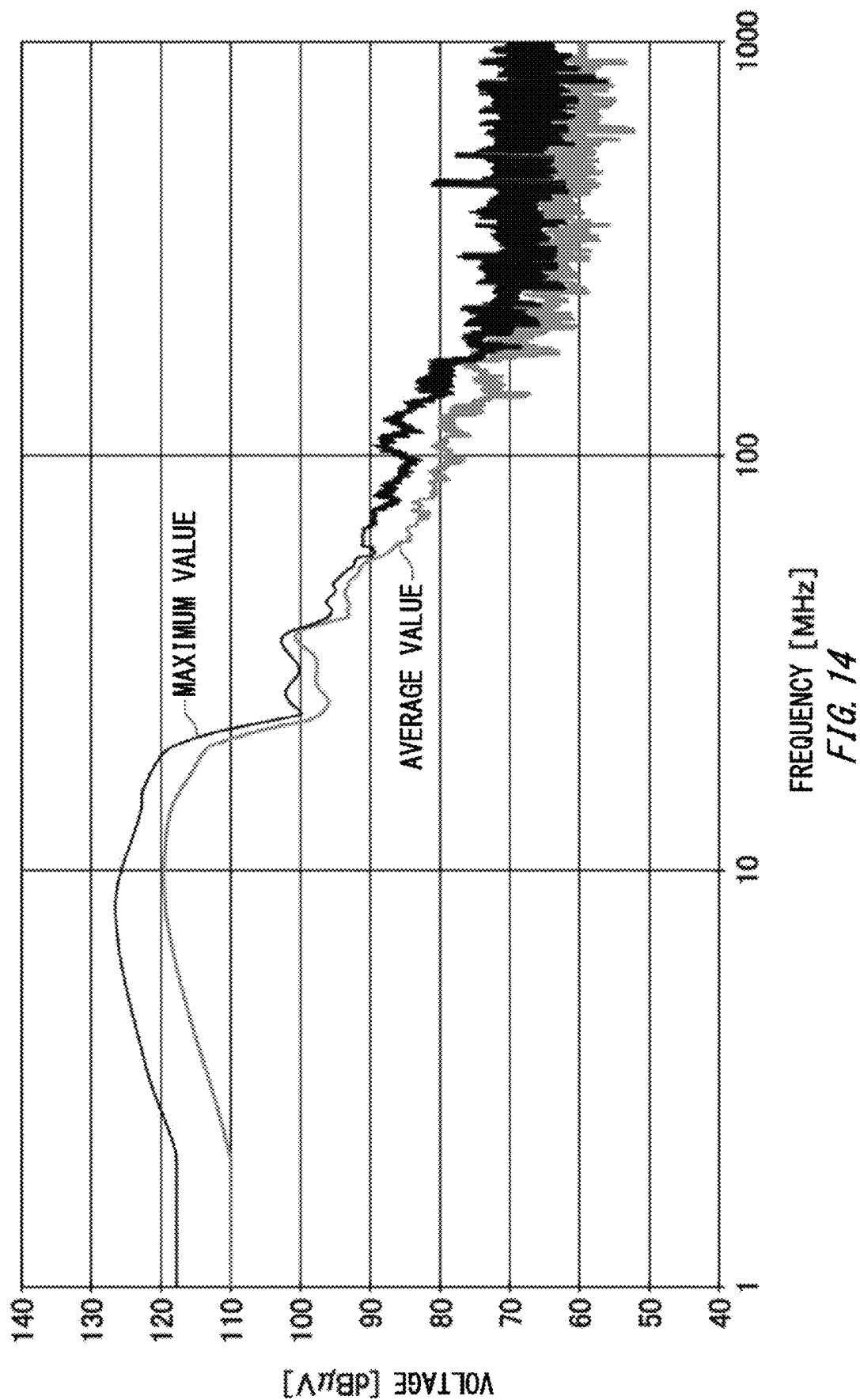
FIG. 14 shows an example of a result of combined evaluation on radiated noise performed by the combined evaluation apparatus 300 according to the present embodiment by combining the plurality of evaluation benchmarks shown in FIG. 11.

FIG. 14 shows examples of the result of combined evaluation on radiated noise performed by the combined evaluation apparatus 300 according to the present embodiment by combining the plurality of evaluation benchmarks shown in FIG. 11. FIG. 14 is an example of the result output by the combined evaluation unit 430 by adopting the maximum value and average value of the plurality of evaluation benchmarks as the combination. That is, the waveform shown as "maximum value" in FIG. 14 indicates the maximum value of the four curves of turn-on characteristics shown in FIG. 11 for each frequency. Also, the waveform shown as "average value" in FIG. 14 indicates the average value of the four curves of turn-on characteristics shown in FIG. 11 for each frequency.

The tendency of the quasi-peak value can be further predicted based on these estimation results of the radiated noise. For example, it can be seen that, in a frequency region from 30 MHz to 60 MHz, the difference in voltage for each frequency between the two waveforms shown by the average value and maximum value is 6 dB or less. Thus, since the peak value and average value of the radiated noise have approximately the same level of intensity in this frequency region, it can be contemplated that the quasi-peak value in the frequency region has as high a level of intensity as the peak value.

Also, it can be seen that, in a frequency region from 100 MHz to 140 MHz, the difference in voltage for each frequency between the two waveforms shown by the average value and maximum value is about 6 dB to 10 dB. Thus, since the peak value and average value of the radiated noise have a large difference in this frequency region, it can be contemplated that the quasi-peak value in the frequency region has as low a level of intensity as the average value.

As described above, the combined evaluation apparatus 300 can combine a plurality of evaluation benchmarks to perform combined evaluation on the radiated noise, and thus can estimate the level of the radiated noise of equipment subject to the regulation based on the result of the combined evaluation. Also, the combined evaluation apparatus 300 can perform combined evaluation on the radiated noise even in the case of a more complex drive signal.

Figure 15:
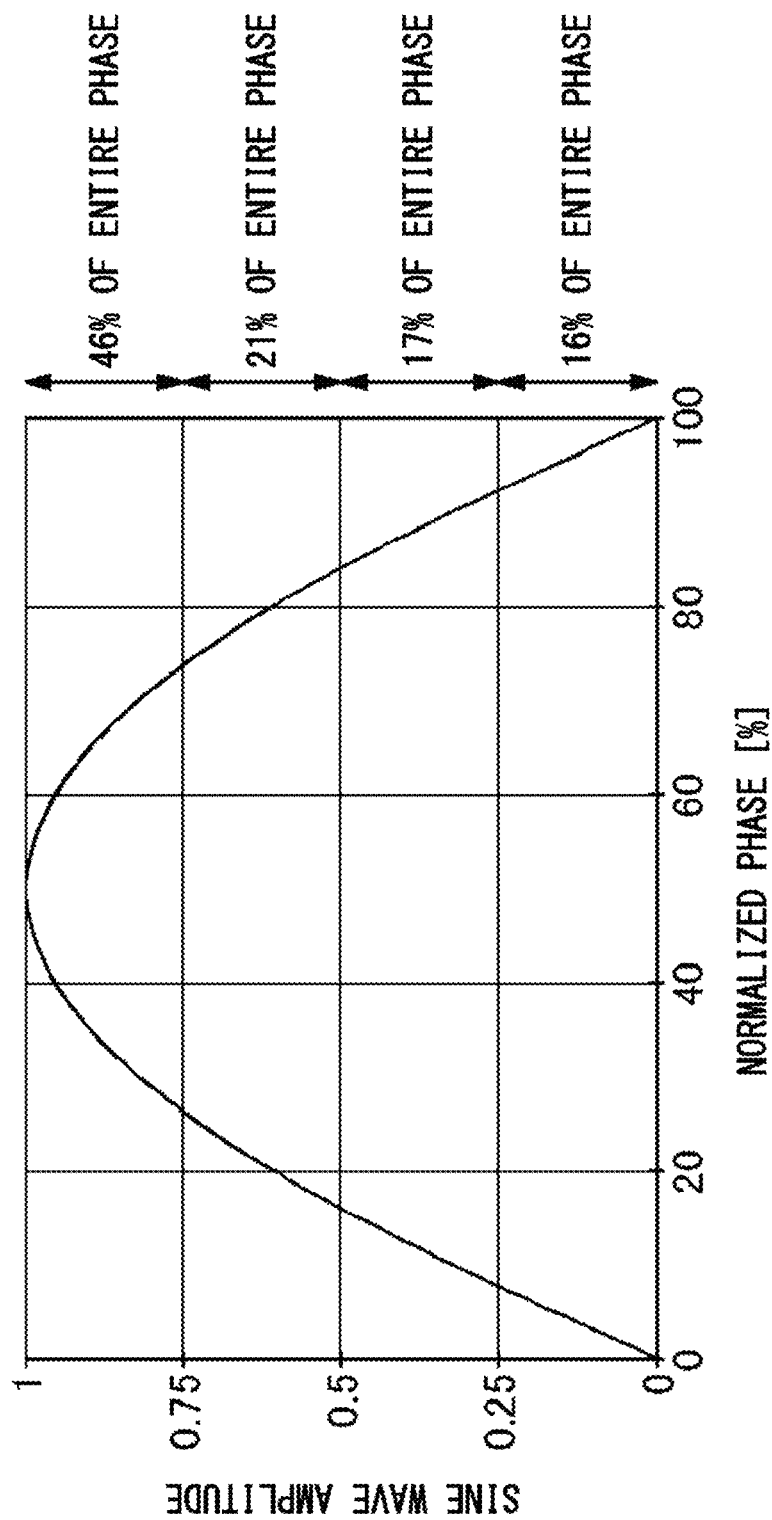
FIG. 15 shows an example of a current waveform output by the to-be-evaluated semiconductor device 10 according to the present embodiment.

FIG. 15 shows an example in which a three-phase inverter is used as the apparatus, for example, and the output current waveform for a half period of a single phase is normalized. In FIG. 15, the horizontal axis is a normalized time axis and the vertical axis indicates normalized amplitude values of the drive signal. Since the output current is part of a sine wave signal, the horizontal axis, which is the time axis in FIG. 15, indicates phases normalized by setting the time corresponding to a phase of 180 degrees as 100%.

When the polarity of the output current is positive as shown in FIG. 15, the acquisition unit 420 acquires an evaluation benchmark output in correspondence with the turn-on operation of the semiconductor device 10, as an example. The acquisition unit 420 may also acquire an evaluation benchmark output by the evaluation apparatus 200 for a condition corresponding to the peak value of the amplitude of the sine wave. The acquisition unit 420 may also acquire an evaluation benchmark output by the evaluation apparatus 200 for a condition closest to the peak value of the amplitude of the sine wave. For example, the acquisition unit 420 multiplies the acquired evaluation benchmark by weights corresponding to the output current to acquire a plurality of evaluation benchmarks.

As an example, the acquisition unit 420 divides the output current into a plurality of regions according to the amplitude value. FIG. 15 shows an example in which the amplitude of the output current is equally divided into four regions of 0 to 0.25, 0.25 to 0.5, 0.5 to 0.75, and 0.75 to 1, with the peak value being 1. The acquisition unit 420 calculates the occupancy of the drive signal on the time axis in each region. For example, in the region of 0 to 0.25 amplitude, the output current occupies the regions of the first rising and last falling on the time axis. That is, in the region of 0 to 0.25 amplitude, the output current occupies 16% of the 100%, entire phase region, and thus the occupancy is set as 16%.

Similarly, for the acquisition unit 420, the occupancy of the region of 0.25 to 0.5 amplitude is set as 17%, the occupancy of the region of 0.5 to 0.75 amplitude is set as 21%, and the occupancy of the region of 0.75 to 1 amplitude is set as 46%. Such distribution of occupancy can be directly replaced with the generation frequency of switching currents in the three-phase inverter operation, and thereby the acquisition unit 420 can calculate a plurality of evaluation benchmarks according to the occupancy.

That is, the acquisition unit 420 calculates a first evaluation benchmark for the region of 0 to 0.25 amplitude by multiplying the voltage of a reference evaluation benchmark, which is obtained for the peak amplitude value of the output current, by 0.16 for each frequency. The acquisition unit 420 also calculates a second evaluation benchmark for the region of 0.25 to 0.5 amplitude by multiplying the reference evaluation benchmark by 0.17. Similarly, the acquisition unit 420 calculates a third evaluation benchmark for the region of 0.5 to 0.75 amplitude and a fourth evaluation benchmark for the region of 0.75 to 1 amplitude by multiplying the reference evaluation benchmark by 0.21 and 0.46, respectively. The combined evaluation unit 430 calculates the per-frequency average value of the four, first to fourth evaluation benchmarks as a combined evaluation value for the radiated noise. The combined evaluation unit 430 outputs the calculated combined evaluation value.

As described above, the combined evaluation apparatus 300 according to the present embodiment uses a plurality of evaluation benchmarks in consideration of the generation frequency of switching currents according to the output current, and thus can perform combined evaluation on the radiated noise more accurately for various output currents. Note that, while an example has been described in which the amplitude of the output current is equally divided into four regions in the present embodiment, this is not so limited. The number of division of the amplitude of the drive signal may be set to various number of division. The weights by which the evaluation benchmarks are multiplied and the like may also be adjustable according to the drive signal.

Figure 16:
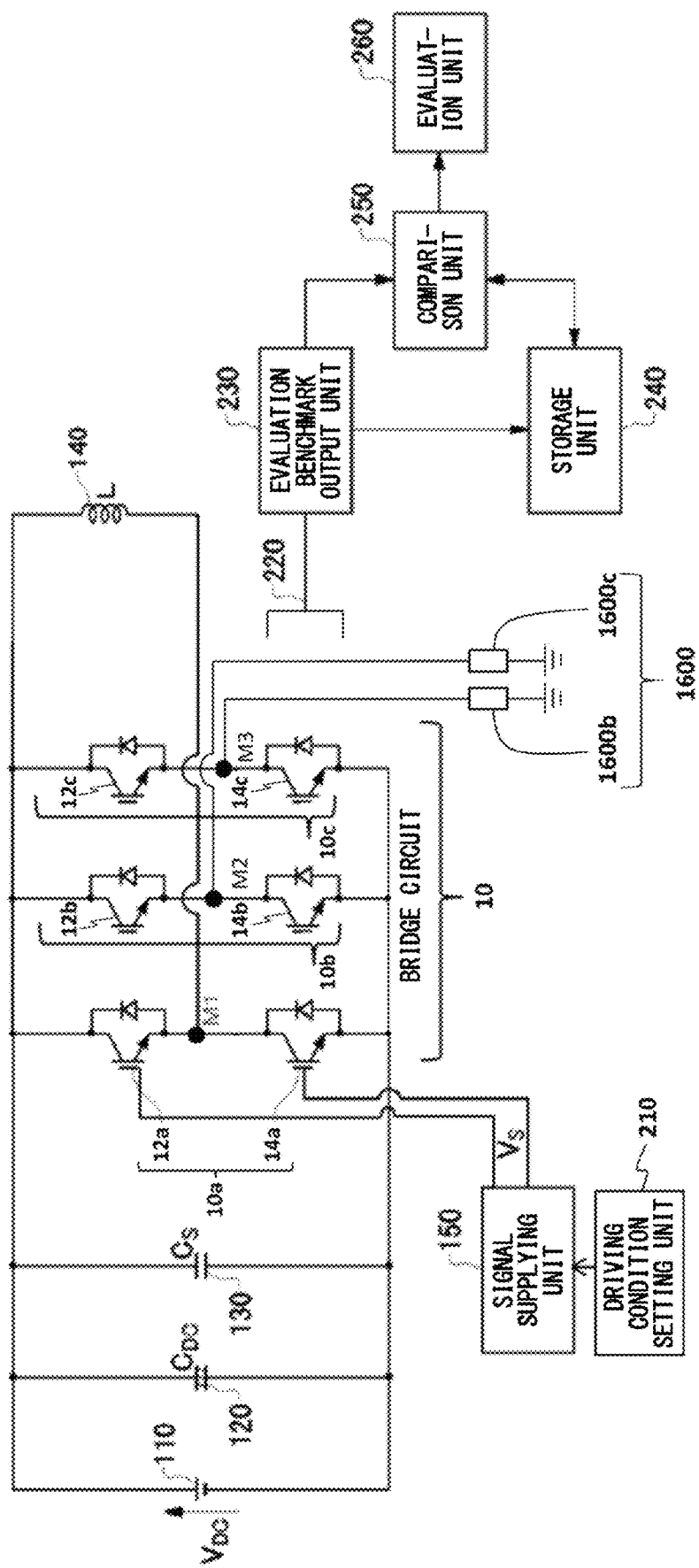
FIG. 16 shows an example in which the semiconductor device 10 according to a first modified example is to be evaluated by the evaluation apparatus 200 of the present embodiment.

FIG. 16 shows an example in which the semiconductor device 10 according to a first modified example is to be evaluated by the evaluation apparatus 200 of the present embodiment. In FIG. 16, the elements having substantially the same functions and configurations as those shown in FIG. 3 are denoted with the same reference signs, and the descriptions thereof are omitted, except differences to be described below. In FIG. 16, the semiconductor device 10 that is to be evaluated by the evaluation apparatus 200 is connected to a termination resistor 1600. The termination resistor 1600 includes a first termination resistor 1600b and a second termination resistor 1600c. The first termination resistor 1600b has one end connected between the third device 12b and the fourth device 14b and the other end connected to a reference potential. The second termination resistor 1600c has one end connected between the fifth device 12c and the sixth device 14c and the other end connected to the reference potential. In this manner, the evaluation apparatus 200 according to the present embodiment may evaluate the semiconductor device 10 in which a center point of the second series circuit 10b and a center point of the third series circuit 10c are terminated with the known impedance.

Figure 17:
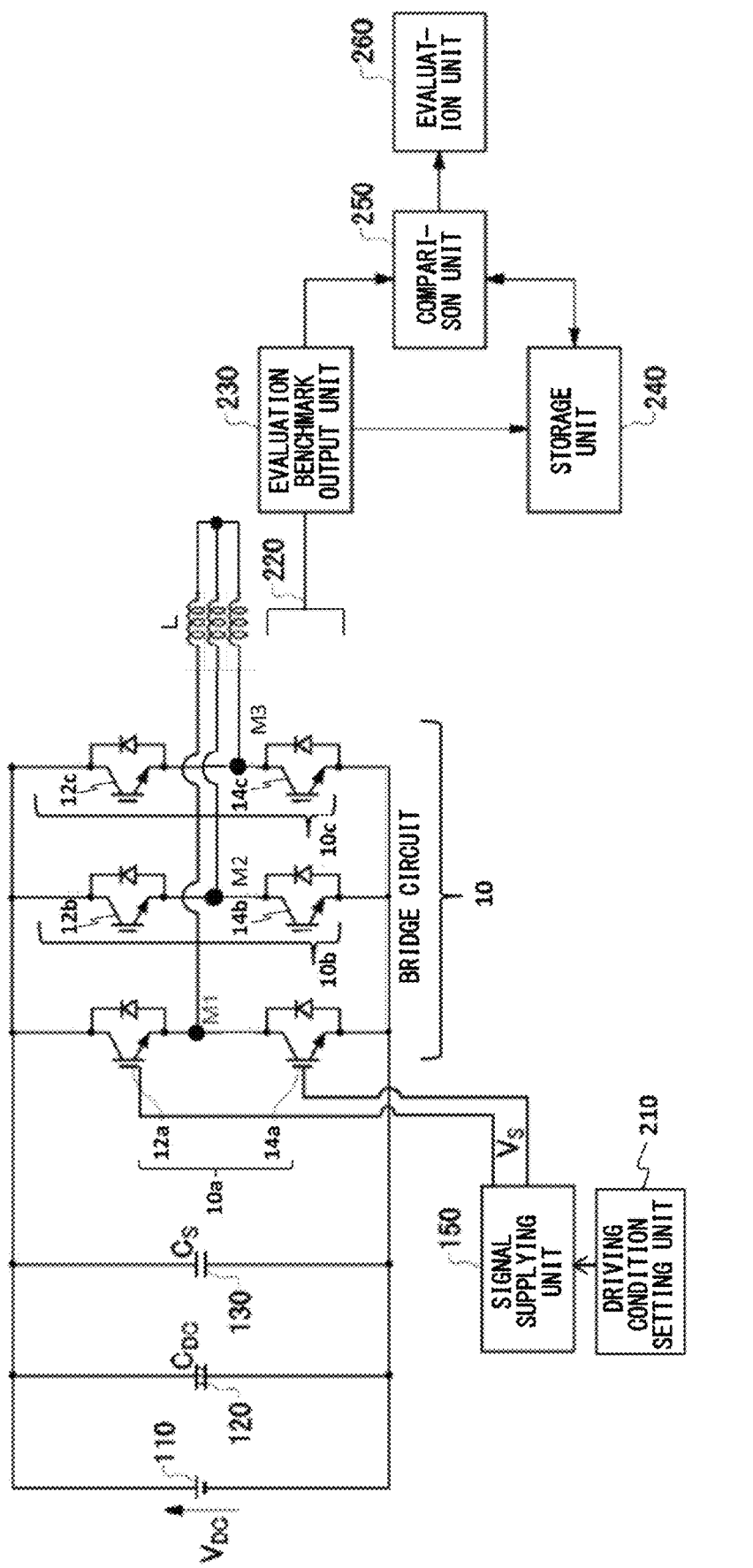
FIG. 17 shows an example in which the semiconductor device 10 according to a second modified example is to be evaluated by the evaluation apparatus 200 of the present embodiment.

FIG. 17 shows an example in which the semiconductor device 10 according to a second modified example is to be evaluated by the evaluation apparatus 200 of the present embodiment. In FIG. 17, the elements having substantially the same functions and configurations as those shown in FIG. 3 are denoted with the same reference signs, and the descriptions thereof are omitted, except differences to be described below. In FIG. 17, the semiconductor device 10 that is to be evaluated by the evaluation apparatus 200 is star-connected between the first device 12a and the second device 14a, between the third device 12b and the fourth device 14b and between the fifth device 12c and the sixth device 14c via inductors, respectively.

Figure 18:
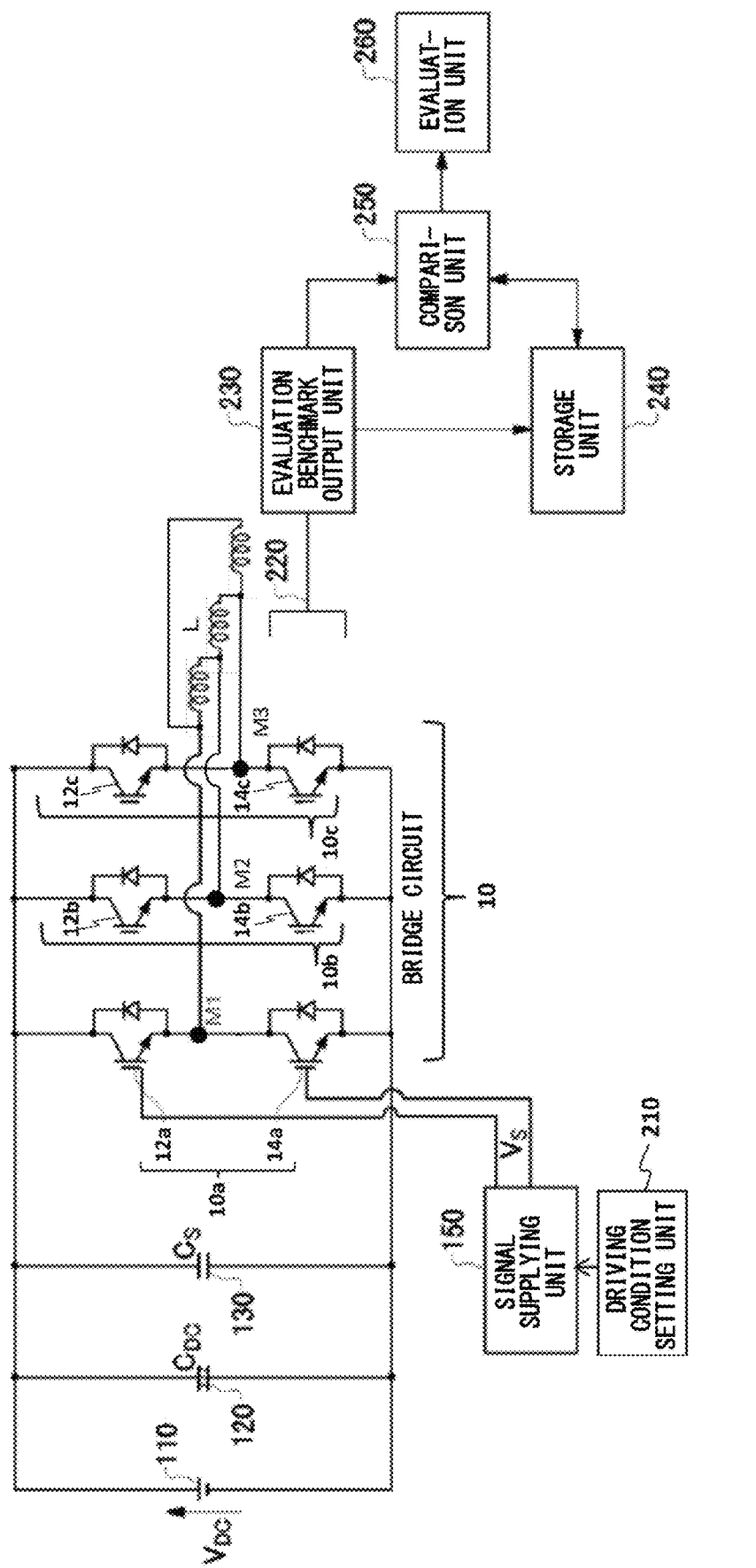
FIG. 18 shows an example in which the semiconductor device 10 according to a third modified example is to be evaluated by the evaluation apparatus 200 of the present embodiment.

FIG. 18 shows an example in which the semiconductor device 10 according to a third modified example is to be evaluated by the evaluation apparatus 200 of the present embodiment. In FIG. 18, the elements having substantially the same functions and configurations as those shown in FIG. 3 are denoted with the same reference signs, and the descriptions thereof are omitted, except differences to be described below. In FIG. 18, the semiconductor device 10 that is to be evaluated by the evaluation apparatus 200 is delta-connected between the first device 12a and the second device 14a, between the third device 12b and the fourth device 14b and between the fifth device 12c and the sixth device 14c via inductors, respectively. For a three-phase AC circuit, configurations in which each of three phases is connected in a star form and in a delta form are widely used. As shown in FIG. 17 and FIG. 18, the evaluation apparatus 200 may evaluate the semiconductor device 10 star-connected and delta-connected. Also, the evaluation apparatus 200 may evaluate the semiconductor device 10 capable of switching the start connection and the delta connection by a switch. In this manner, the evaluation apparatus 200 can evaluate the radiated noise under the same load conditions as the actually operating conditions, thereby reproducing more truly radiated noise to occur during the actual operation.

In the case of the connections as shown in FIG. 17 and FIG. 18, the driving condition setting unit 210 may limit the conditions for driving the semiconductor device 10. For example, when the switching signal $V_S$ is supplied to the gate terminal of the second device 14a and the off signal is supplied to the gate terminal of the first device 12a, the connection from the (+) terminal of the power supply 110 to the collector terminal of the second device 14a may be disconnected in a case in which the off signal is supplied to the gate terminals of both the third device 12b and the fifth device 12c. Also, for example, when the second device 14a is caused to perform the turn-off operation, a return path of current caused to flow by the inductance L may be disconnected in the case in which the off signal is supplied to the gate terminals of both the third device 12b and the fifth device 12c. Therefore, when evaluating the semiconductor device 10 connected in the manner as shown in FIG. 17 or FIG. 18, the driving condition setting unit 210 may cause the semiconductor device 10 to perform switching operations, except the driving conditions under which the current path may be disconnected. Alternatively, the driving condition setting unit 210 may limit the conditions for driving the semiconductor device 10 in a stage before the second device 14a is caused to perform switching operations. For example, the driving condition setting unit 210 may set a condition under which current, which can be caused to continuously flow even when the second device 14a is turned on, is caused to flow in the inductance L in advance before the second device 14a is turned on, in a stage before the switching operations are performed. For example, in a stage before the second device 14a is turned on, the driving condition setting unit 210 may set a driving condition so that the semiconductor device 10 is controlled to generate at least one of currents, which are to flow from M2 toward M1 and from M3 to M1, in the inductance L and the second device 14a is turned on in this state. Specifically, the third device 12b and the fifth device 12c are turned on from an initial state in which the first device 12a to the sixth device 14c are all in off states, so that current is caused to flow through a path of the third device 12b or the fifth device 12c, the inductor L, and the anti-parallel connected diode to the first device 12a. Then, the second device 14a may be turned on to cause the first device 12a to perform the reverse recovery operation. In the meantime, the conditions for causing the third device 12b and fifth device 12c configuring the upper arm except the first device 12a or the second device 14a, fourth device 14b and sixth device 14c configuring the lower arm to perform the reverse recovery operation are the same, from a standpoint of symmetry, and the descriptions thereof are thus omitted.

Figure 19:
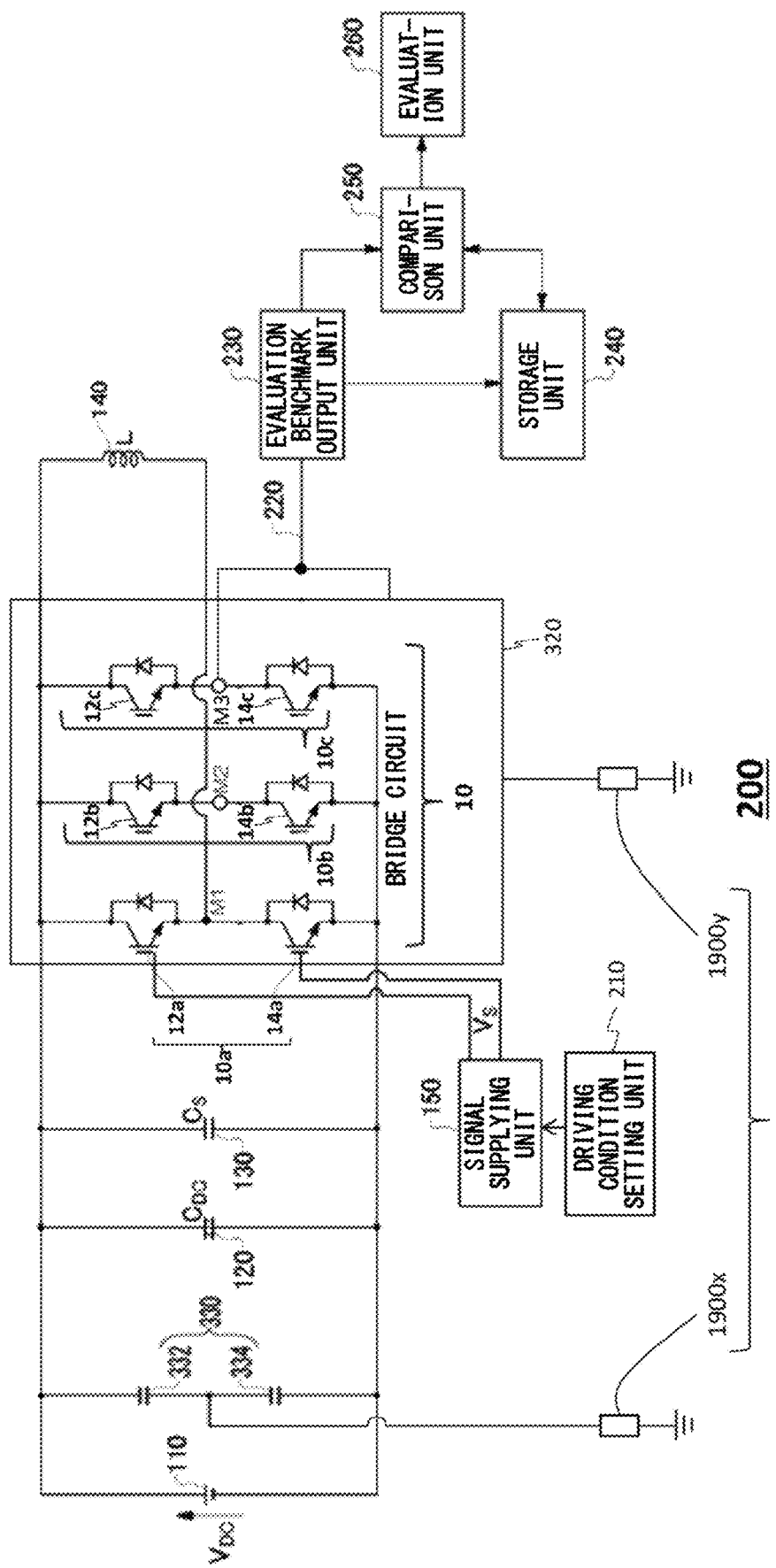
FIG. 19 shows another modified example of the evaluation apparatus 200 according to the present embodiment.

FIG. 19 shows another modified example of the evaluation apparatus 200 of the present embodiment. In FIG. 19, the elements having substantially the same functions and configurations as those shown in FIG. 10 are denoted with the same reference signs, and the descriptions thereof are omitted, except differences to be described below. In FIG. 19, the evaluation apparatus 200 further includes an impedance element 1900. The impedance element 1900 includes a first impedance element 1900x and a second impedance element 1900y. The first impedance element 1900x has one end connected to a center point of the third capacitive unit 330 and the other end connected to a reference potential. The second impedance element 1900y has one end connected to the conductive member 320 and the other end connected to the reference potential. In this way, the evaluation apparatus 200 may be further provided with the known impedance element in a frequency of 30 MHz or higher, instead of the capacitive element or in addition to the capacitive element. Also, the conductive member 320 and the reference potential may be interconnected via the known impedance element in the frequency of 30 MHz or higher.

As described above, the evaluation apparatus 200 and the combined evaluation apparatus 300 according to the present embodiment can evaluate the radiated noise that would be caused if an apparatus or the like is equipped with the semiconductor device 10 before the equipment of the apparatus. Also, even if the drive signal for driving the semiconductor device 10 is complex, the combined evaluation apparatus 300 can perform combined evaluation on the radiated noise by combining the evaluation benchmarks output by the evaluation apparatus 200.

Also, outputting the evaluation benchmarks output by the evaluation apparatus 200 as a data sheet for the semiconductor device 10 allows providing useful information for facilitating the device design. Note that, in this case, it is desirable that the evaluation apparatus 200 outputs the evaluation benchmarks together with an evaluation result for a previous device. This makes it able to, for example, easily find a benchmark for how much the radiated noise decreases or increases compared to the case of the device previously used, so as to smoothly conduct the device design.

In the above, the example in which the radiated noise is estimated from the evaluation benchmarks output by the evaluation apparatus 200 has been described. However, conducted noise may also be estimated using the same method. In the meantime, the frequency band regulated by the international standards is different in the conducted noise and the radiated noise, and a to-be-regulated upper limit of the conducted noise such as 30 MHz, 108 MHz and the like is normally set lower than that of the radiated noise. For this reason, the to-be-evaluated frequencies of the radiated noise and the conducted noise may be individually set, depending on the to-be-regulated noises.

An example of the device design includes determining the driving condition or driving circuit constants for the semiconductor device in advance to meet the international standards. Specifically, the driving condition includes the relationship between the gate voltage value input to the gate terminal of the semiconductor device and time, and the like. Also, the driving circuit constants include a gate resistance value, a gate runner inductance value, a capacitance, the specification of a power supply used, and the like. Furthermore, if the radiated noise generated at the time of turn-on of a semiconductor device in the lower arm of a half-bridge circuit is dominant, for example, the driving condition, driving circuit constants or the like of the semiconductor device in the lower arm is adjusted. The configuration of the apparatus includes providing a shield plate between the semiconductor device with dominant radiated noise and a printed circuit board, determining arrangements in the apparatus according to the intensity of radiated noise, providing a shield plate to the apparatus housing, connecting to the ground, and the like.

For the design of the semiconductor device, internal resistance values or the like of the device may be adjusted. Also, the design of a module equipped with the semiconductor device may include adjustments for insulating substrates, resin insulating substrates and the like such as the adjustment of the number of such substrates, circuit patterns formed thereon, thicknesses, current paths, and thicknesses and materials of insulating plates used for the insulating substrates and the like, and the adjustment or the like of the shape, dimension, and material of wirings (wires, lead flames and the like) bonded to surface electrodes formed on the semiconductor device, the adjustment or the like of the shape and material of the housing (case) used for the module.

Note that, while the evaluation apparatus 200 and the combined evaluation apparatus 300 are described as separate, independent apparatuses in the present embodiment, they are not limited to such configuration. For example, the evaluation apparatus 200 and the combined evaluation apparatus 300 may be constituted as a single apparatus. Also, the evaluation apparatus 200 and/or the combined evaluation apparatus 300 may be at least partially constituted with a computer or the like.

Various embodiments of the present invention may be described with reference to flowcharts and block diagrams whose blocks may represent (1) steps of processes in which operations are performed or (2) units of apparatuses responsible for performing operations. Certain steps and units may be implemented by dedicated circuitry, programmable circuitry supplied with computer-readable instructions stored on computer-readable media, and/or processors supplied with computer-readable instructions stored on computer-readable media.

Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc.

More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY(registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), a wide area network (WAN) such as the Internet, and the like. Thereby, the processor of a general purpose computer, special purpose computer, or other programmable data processing apparatus or the programmable circuitry can execute the computer-readable instructions so as to create means for performing operations specified in the flowcharts or block diagrams. Examples of the processor include a computer processor, a processing unit, a microprocessor, a digital signal processor, a controller, a microcontroller, and the like.

Although the present invention has been described with reference to the embodiments, the technical scope of the present invention is not limited to the scope described in the embodiments. It is obvious to one skilled in the art that the embodiments can be diversely changed or improved. It is obvious from the claims that the changes or improvements can also be included within the technical scope of the present invention.

The operations, procedures, steps, and stages of each process performed by an apparatus, system, program, and method shown in the claims, embodiments and drawings can be performed in any order as long as the order is not explicitly indicated by "prior to," "before," or the like and as long as the output from a previous process is not used in a later process. Even if the process flow is described using phrases such as "first" or "next" in the claims, embodiments and drawings, it does not necessarily mean that the process must be performed in this order.

What is claimed is:

1. An evaluation method comprising:
    causing one of a first device and a second device of a semiconductor device to perform a switching operation, the semiconductor device comprising the first device and second device connected in series and a third device and a fourth device connected to each other in series and connected parallel to a series circuit of the first device and second device;
    measuring voltages at a collector or an emitter of each of the third device and the fourth device during the switching operation or at a collector or an emitter in at least one of the third device and the fourth device during the switching operation;
    determining voltage variation of the measured voltages; and
    outputting an evaluation benchmark for electromagnetic noise of the semiconductor device, based on the voltage variation.

2. The evaluation method according to claim 1, wherein the semiconductor device further comprises a fifth device and a sixth device connected to each other in series and connected parallel to the series circuit of the first device and second device, further comprising:
    measuring second voltages at a collector or an emitter of each of the fifth device and the sixth device during the switching operation or at a collector or an emitter in at least one of the fifth device and the sixth device during the switching operation; and
    determining voltage variation of the measured second voltages;
    wherein
    the evaluation benchmark is further based on the voltage variation of the measured second voltages.

3. The evaluation method according to claim 1, further comprising:
    comparing the evaluation benchmark output to the semiconductor device and the evaluation benchmark output to a reference device different from the semiconductor device, and
    evaluating an intensity of the electromagnetic noise of the semiconductor device as compared to the reference device, based on a result of the comparison.

4. The evaluation method according to claim 1, wherein the outputting the evaluation benchmark comprises calculating the voltage variation in the semiconductor device for each frequency component, as the evaluation benchmark.

5. The evaluation method according to claim 1, wherein the switching operation comprises at least two of a turn-on operation, a turn-off operation, a reverse recovery operation and a forward recovery operation of the semiconductor device.

6. The evaluation method according to claim 5, wherein the switching operation comprises at least the reverse recovery operation of the semiconductor device.

7. The evaluation method according to claim 1, wherein the measuring comprises measuring variation in a voltage of the semiconductor device relative to a reference potential, the reference potential being a potential of a conductive member to which the semiconductor device is attached via an insulating material.

8. An estimation method for estimating electromagnetic noise of an apparatus provided with the semiconductor device, the estimation method comprising:
   acquiring a plurality of evaluation benchmarks for the semiconductor device that are output in correspondence with the switching operation under a plurality of conditions by using the evaluation method according to claim 1; and
   combining the plurality of evaluation benchmarks to estimate the electromagnetic noise of the apparatus.

9. The estimation method according to claim 8, wherein a combination of the evaluation benchmarks is a maximum value or a sum of the plurality of evaluation benchmarks for the semiconductor device.

10. The estimation method according to claim 8, wherein a combination of the evaluation benchmarks is an average value of the plurality of evaluation benchmarks for the semiconductor device.

11. The estimation method according to claim 8, wherein a combination of the evaluation benchmarks is an average value calculated after multiplying the plurality of evaluation benchmarks for the semiconductor device by respective weights corresponding to the plurality of conditions.

12. An evaluation apparatus comprising:
   a signal supplying unit configured to supply a predetermined switching signal to a semiconductor device comprising a first device and a second device connected in series and a third device and a fourth device connected to each other in series and connected parallel to a series circuit of the first device and second device;
   a detection unit configured to measure voltages at a collector or an emitter of each of the third device and the fourth device during a switching operation of one of the first device and the second device or at a collector or an emitter in at least one of the third device and the fourth device during a switching operation of one of the first device and the second device and determine voltage variation of the measured voltages; and
   an evaluation benchmark output unit configured to output an evaluation benchmark for electromagnetic noise of the semiconductor device, based on the voltage variation.

13. The evaluation apparatus according to claim 12, wherein the semiconductor device further comprises a fifth device and a sixth device connected to each other in series and connected parallel to the series circuit of the first device and second device, and the detection unit is further configured to measure second voltages at a collector or an emitter of each of the fifth device and the sixth device or at a collector or an emitter in at least one of the fifth device and the sixth device and determine voltage variation of the measured second voltages;
   wherein the evaluation benchmark is further based on the voltage variation of the measured second voltages.

14. The evaluation apparatus according to claim 12, further comprising:
   a storage unit configured to store the evaluation benchmark output by the evaluation benchmark output unit;
   a comparison unit configured to compare the evaluation benchmark output by the evaluation benchmark output unit and the evaluation benchmark output to a reference device different from the semiconductor device stored in the storage unit; and
   an evaluation unit configured to evaluate a relative change in intensity of the evaluation benchmark for the electromagnetic noise of the semiconductor device, based on a result of the comparison.

15. An evaluation apparatus comprising:
   a signal supplying unit configured to supply a predetermined switching signal to a to-be-evaluated semiconductor device;
   a detection unit configured to measure voltages at one or more of a collector or an emitter to detect voltage variation in a semiconductor device connected parallel to the semiconductor device;
   an evaluation benchmark output unit configured to output an evaluation benchmark for electromagnetic noise of the semiconductor device, based on a detection result of the detection unit;
   a storage unit configured to store the evaluation benchmark output by the evaluation benchmark output unit;
   a comparison unit configured to compare the evaluation benchmark output by the evaluation benchmark output unit and the evaluation benchmark output to a reference device different from the semiconductor device stored in the storage unit; and
   an evaluation unit configured to evaluate a relative change in intensity of the evaluation benchmark for the electromagnetic noise of the semiconductor device, based on a result of the comparison.

16. The evaluation apparatus according to claim 12, wherein the evaluation benchmark output unit is configured to calculate an electric field strength corresponding to the electromagnetic noise of the semiconductor device, based on a frequency component of the voltage variation.

17. The evaluation apparatus according to claim 12, wherein the signal supplying unit is configured to supply a switching signal to cause the semiconductor device to perform at least two of a turn-on operation, a turn-off operation, a reverse recovery operation and a forward recovery operation.

18. A combined evaluation apparatus comprising:
   an acquisition unit configured to acquire a plurality of evaluation benchmarks for the semiconductor device that are output in correspondence with the switching signal under a plurality of conditions by the evaluation apparatus according to claim 12; and
   a combined evaluation unit configured to combine the plurality of evaluation benchmarks to estimate electromagnetic noise of an apparatus provided with the semiconductor device.

* * * * *